(12) United States Patent
Okuyama et al.

(10) Patent No.: US 12,021,172 B2
(45) Date of Patent: Jun. 25, 2024

(54) LIGHT-EMITTING ELEMENT AND IMAGE DISPLAYING APPARATUS

(71) Applicant: SONY SEMICONDUCTOR SOLUTIONS CORPORATION, Kanagawa (JP)

(72) Inventors: Hiroyuki Okuyama, Kanagawa (JP); Masaki Shiozaki, Kanagawa (JP); Shinsuke Nozawa, Kanagawa (JP); Naoki Furukawa, Kanagawa (JP); Nobuhiro Subawara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 413 days.

(21) Appl. No.: 17/284,366

(22) PCT Filed: Oct. 4, 2019

(86) PCT No.: PCT/JP2019/039366
§ 371 (c)(1),
(2) Date: Apr. 9, 2021

(87) PCT Pub. No.: WO2020/080153
PCT Pub. Date: Apr. 23, 2020

(65) Prior Publication Data
US 2021/0351324 A1 Nov. 11, 2021

(30) Foreign Application Priority Data
Oct. 19, 2018 (JP) .................................. 2018-197374

(51) Int. Cl.
*H01L 33/38* (2010.01)
*H01L 27/15* (2006.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC ...... H01L 33/382; H01L 33/62; H01L 27/156
(Continued)

(56) References Cited

U.S. PATENT DOCUMENTS

2012/0235168 A1 9/2012 Katsuno et al.
2015/0041836 A1* 2/2015 Saito ....................... H01L 27/15
257/89

(Continued)

FOREIGN PATENT DOCUMENTS

CN 102655197 A 9/2012
CN 106471630 A 3/2017
(Continued)

OTHER PUBLICATIONS

International Search Report and Written Opinion of PCT Application No. PCT/JP2019/039366, dated Dec. 10, 2019, 10 pages of ISRWO.

*Primary Examiner* — Igwe U Anya
(74) *Attorney, Agent, or Firm* — CHIP LAW GROUP

(57) ABSTRACT

A light-emitting element according to an embodiment of the present disclosure includes: a semiconductor layer having a first surface and a second surface, and including a first conductive-type layer, an active layer, and a second conductive-type layer that are stacked in order from the first surface side; a first dielectric layer provided on the second surface side of the semiconductor layer and having an opening; a first electrode electrically coupled to the first conductive-type layer on the first surface side of the semiconductor layer; and a second electrode provided on the first dielectric layer and electrically coupled to the second conductive-type layer via the opening.

16 Claims, 13 Drawing Sheets

(58) Field of Classification Search
USPC .......................................................... 257/79
See application file for complete search history.

(56) References Cited

U.S. PATENT DOCUMENTS

| | | | |
|---|---|---|---|
| 2017/0133554 A1* | 5/2017 | Okuyama | ........... H01L 25/0753 |
| 2018/0062047 A1* | 3/2018 | Biwa | ................... H01L 33/0008 |

FOREIGN PATENT DOCUMENTS

| | | | |
|---|---|---|---|
| JP | 2008-130861 A | | 6/2008 |
| JP | 2008130861 A | * | 6/2008 |
| JP | 2012-195321 A | | 10/2012 |
| JP | 2013-102068 A | | 5/2013 |
| JP | 2016-004892 A | | 1/2016 |
| WO | 2015/194095 A1 | | 12/2015 |

* cited by examiner

[FIG. 1A]
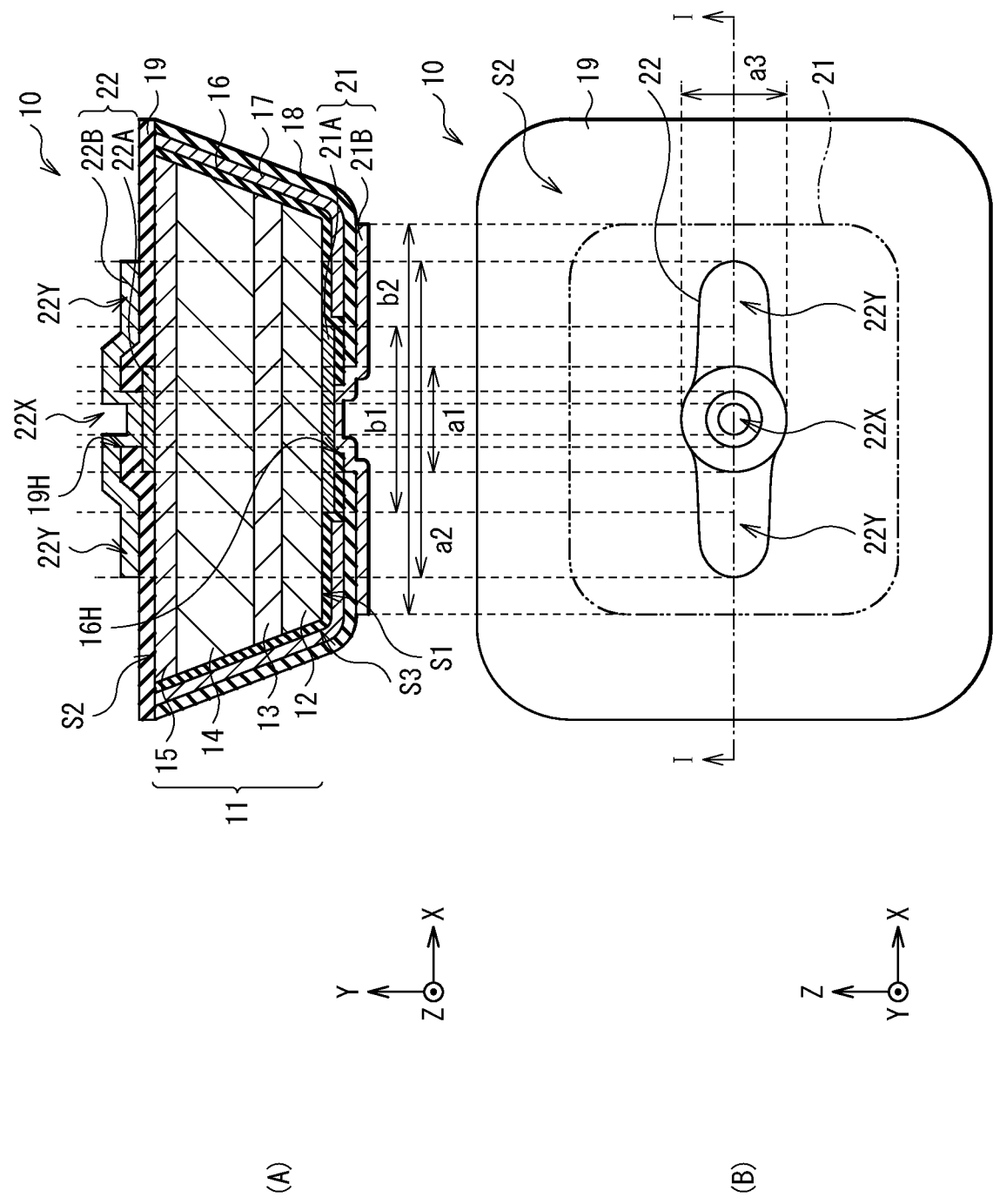

[FIG. 1B]
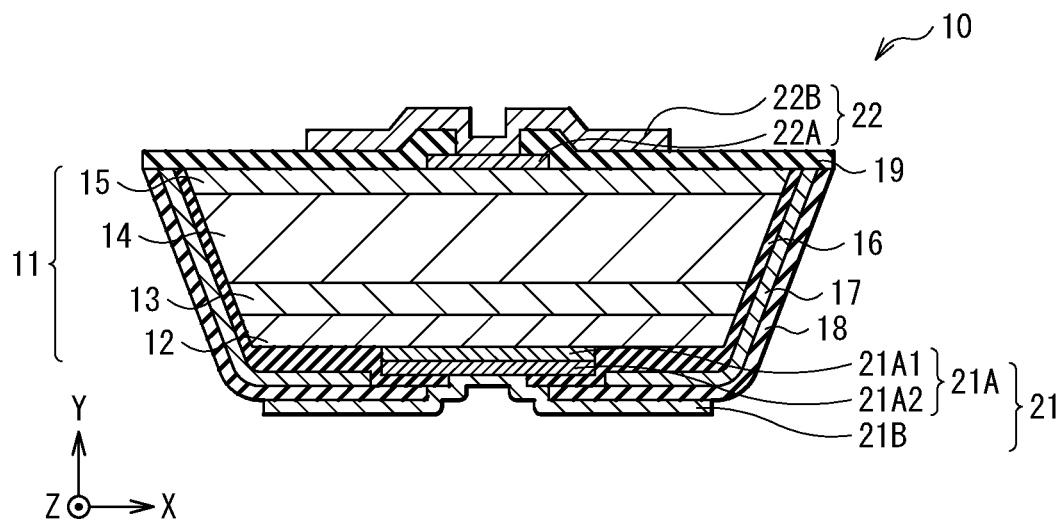
[FIG. 1C]
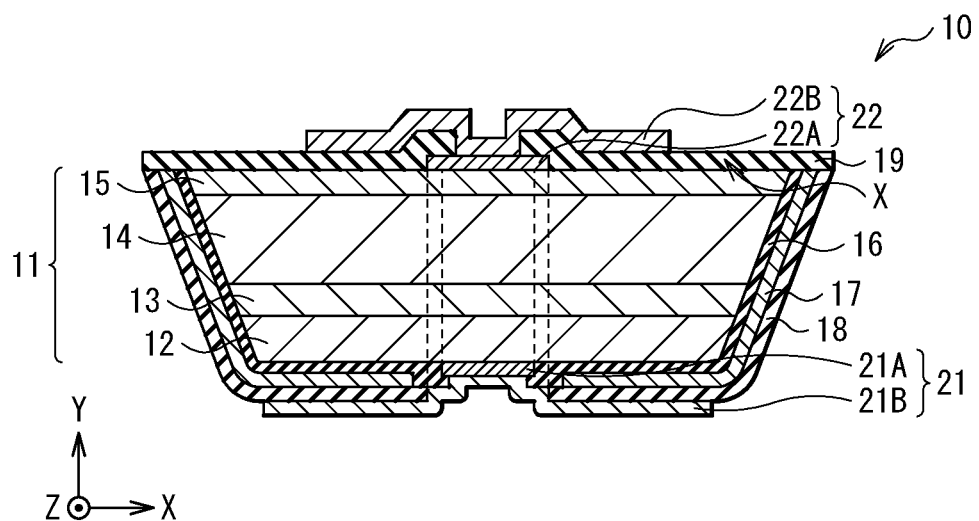

[FIG. 2A]
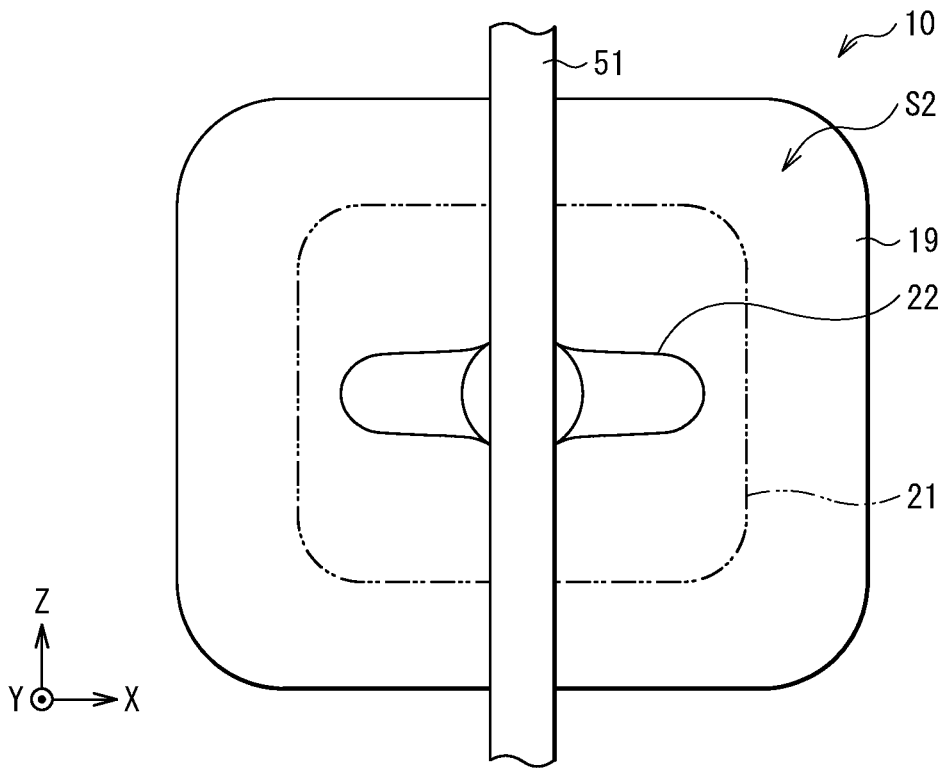
[FIG. 2B]
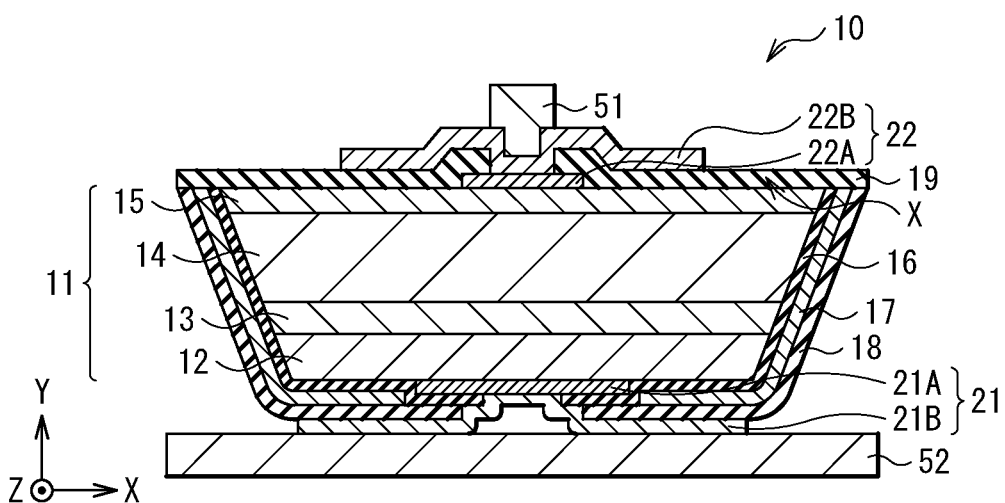

[FIG. 3A]
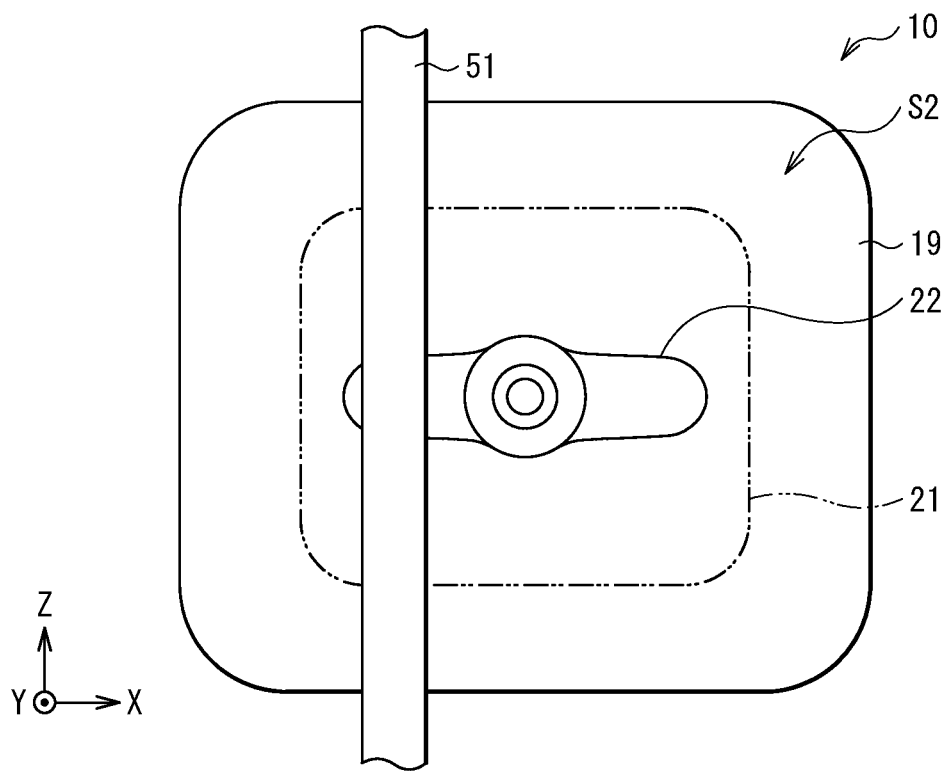
[FIG. 3B]
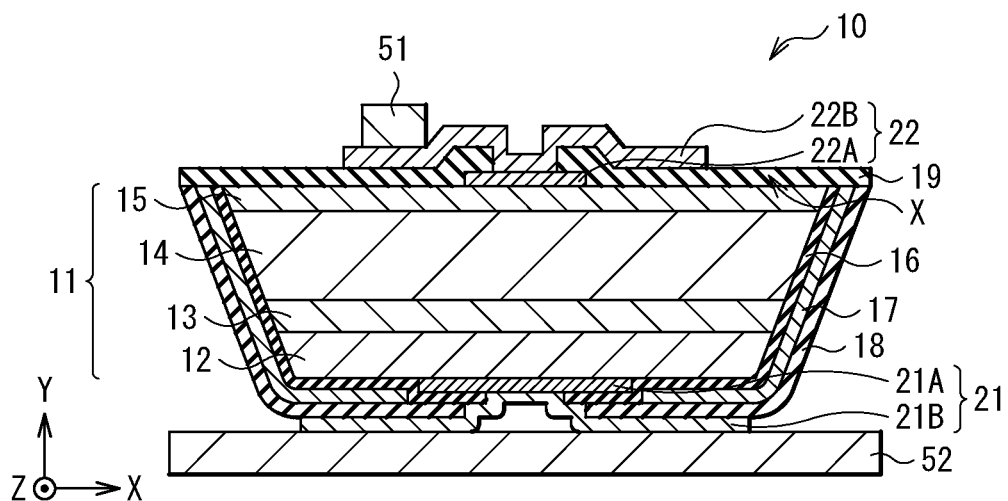

[FIG. 4A]
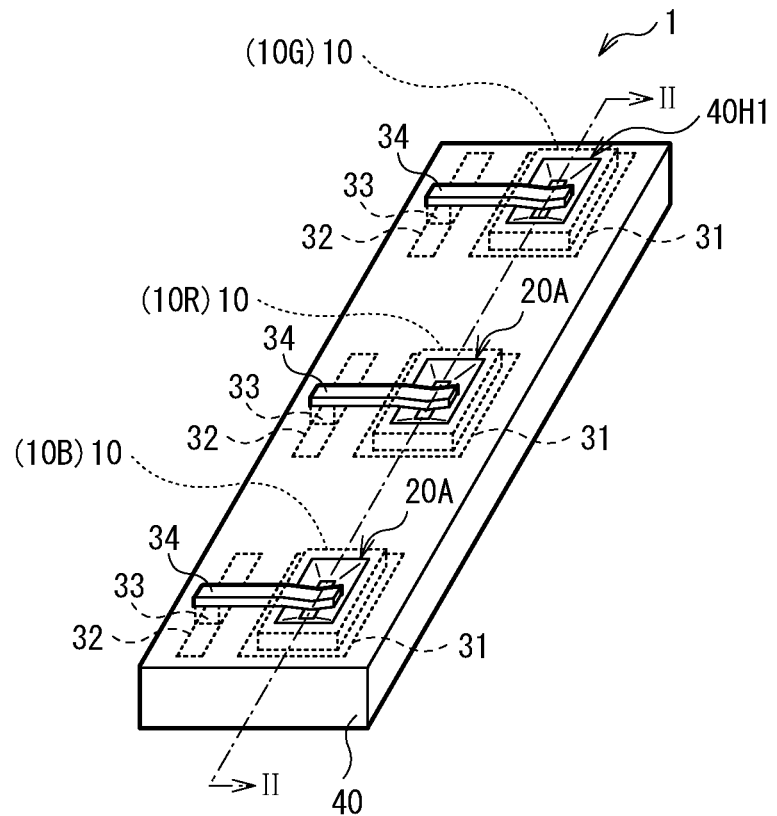
[FIG. 4B]
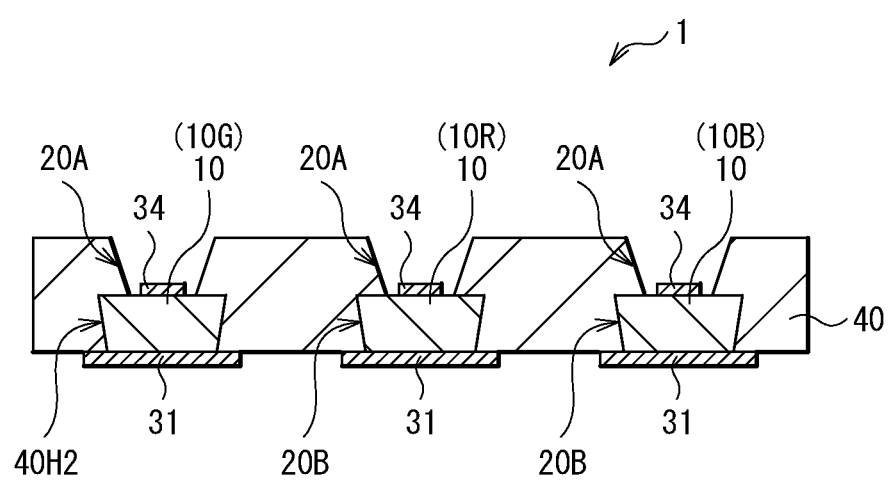

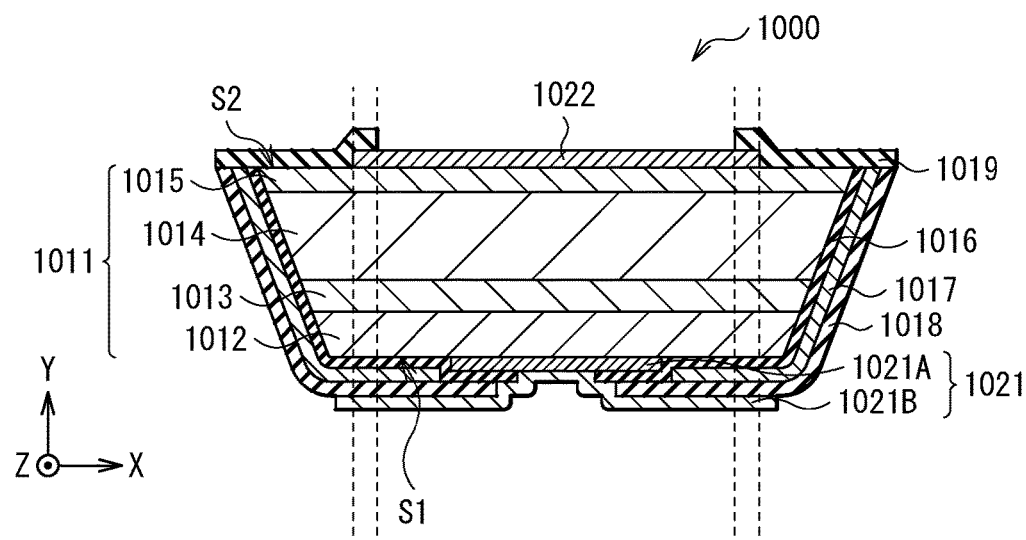
[FIG. 5A]
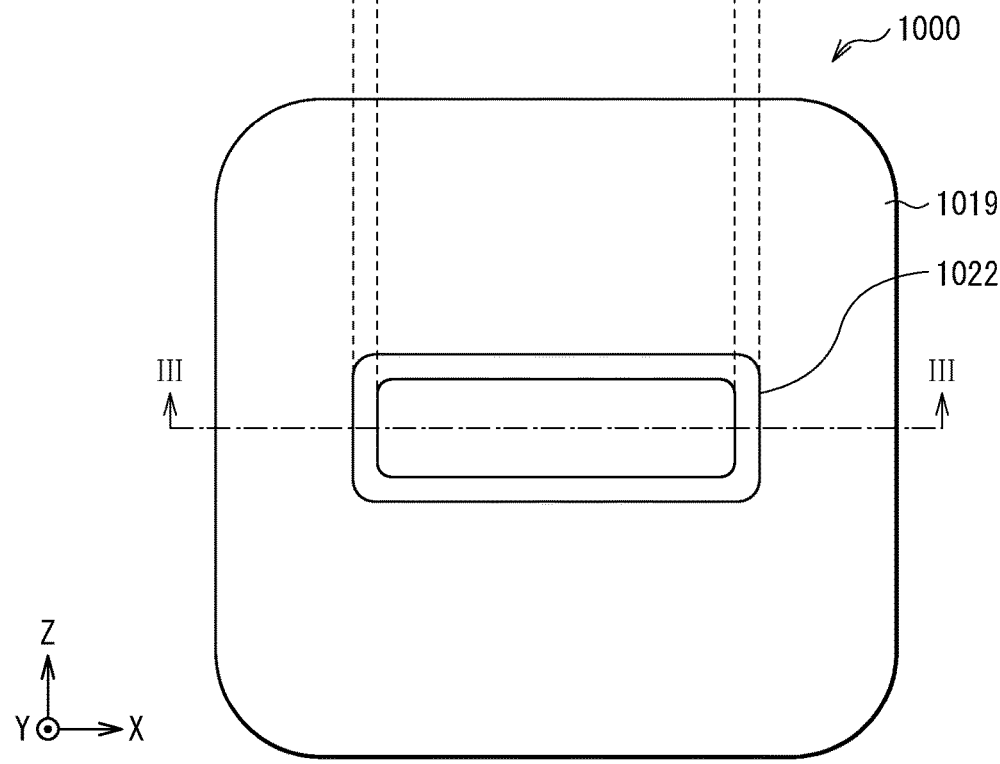
[FIG. 5B]

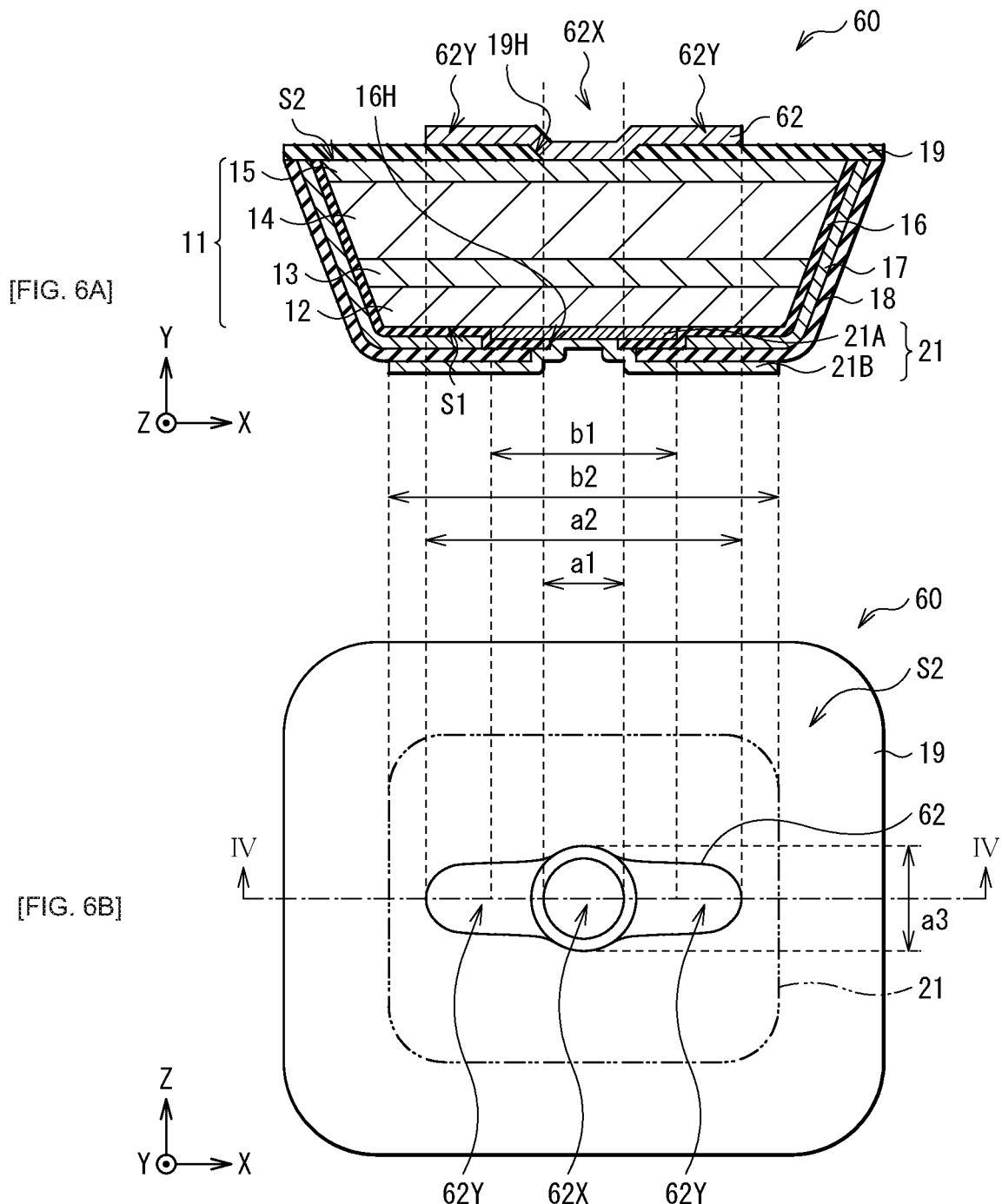

[FIG. 7A]
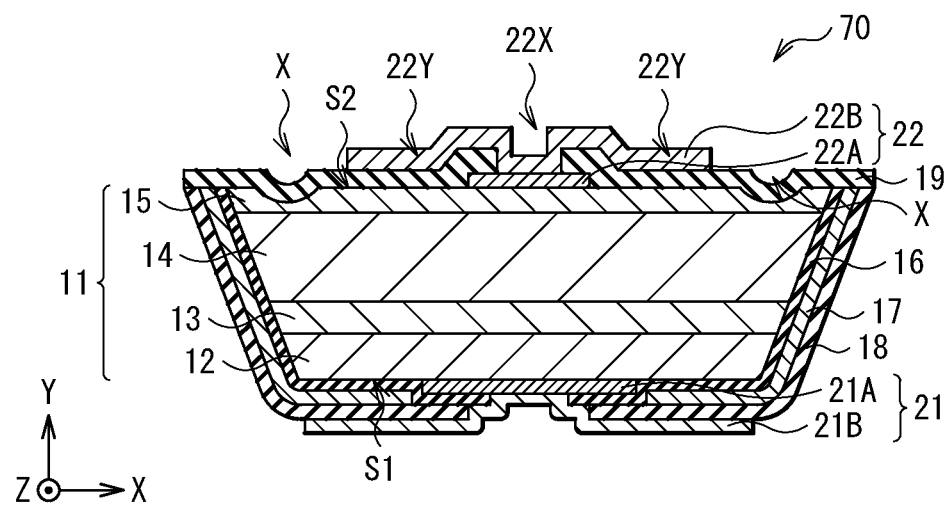
[FIG. 7B]
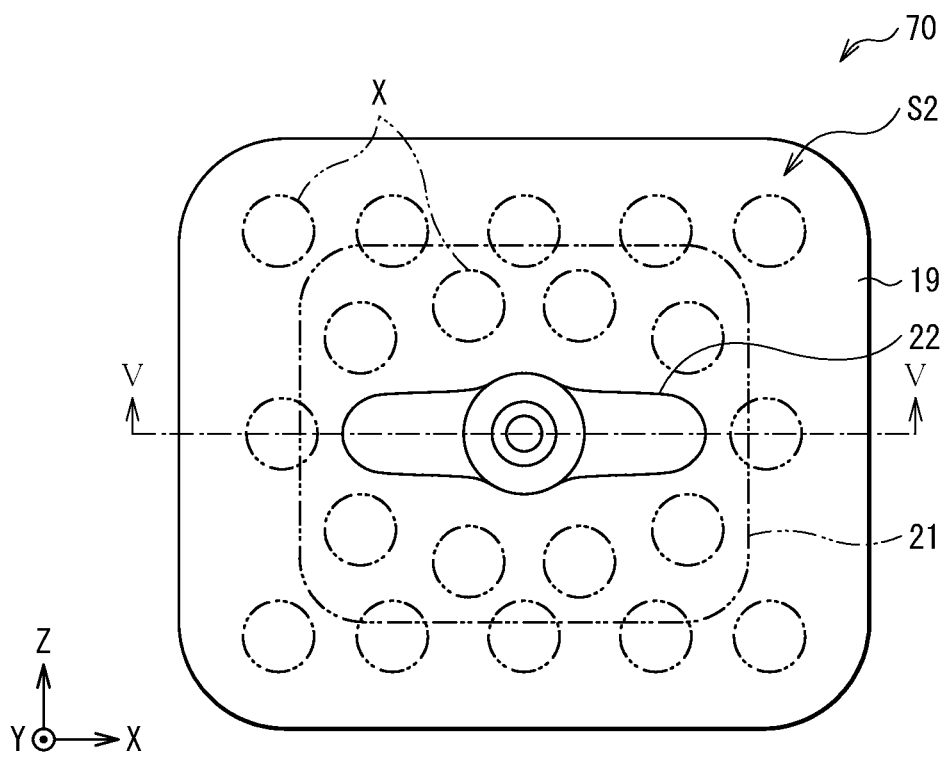

[FIG. 8]
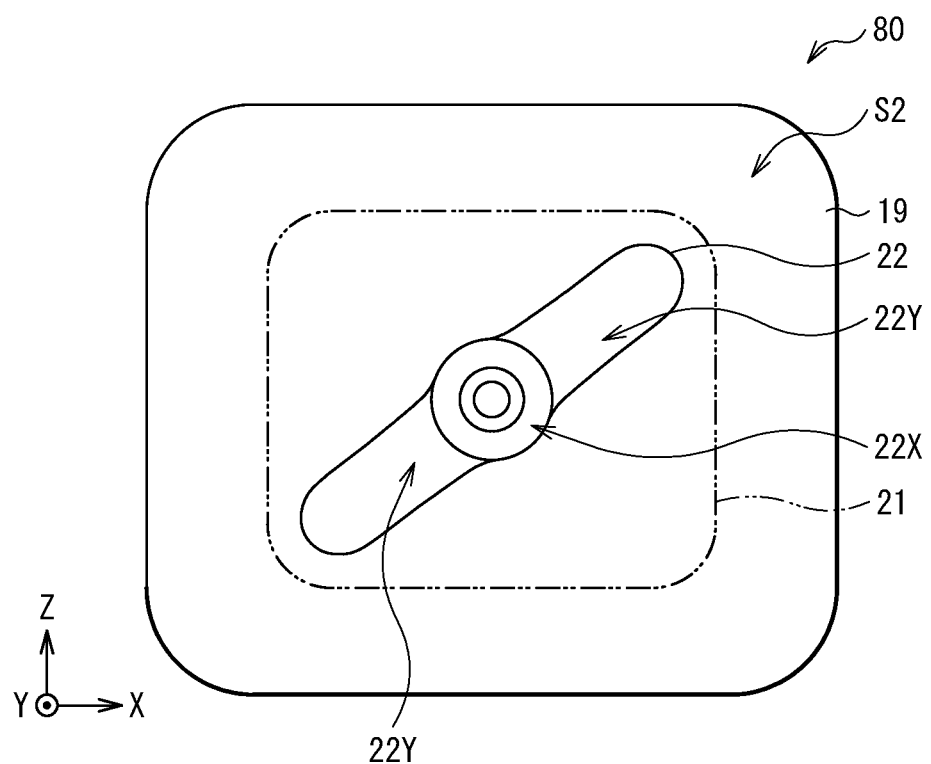

[FIG. 9]
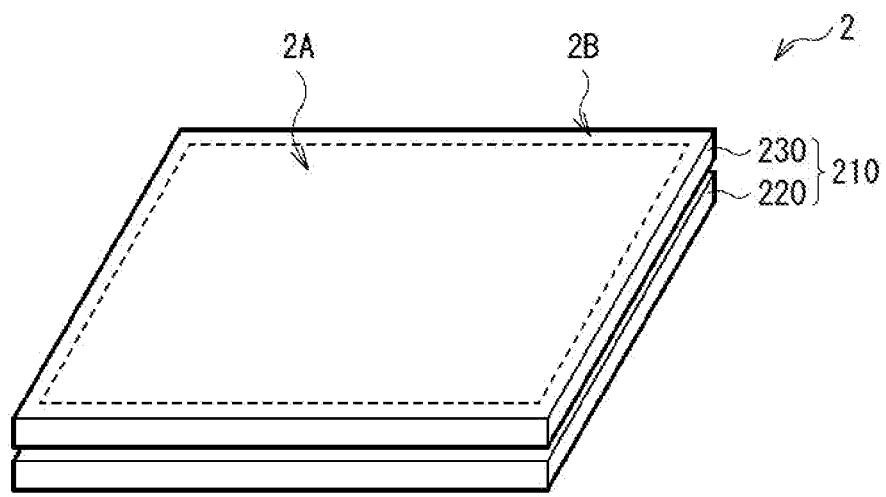
[FIG. 10]
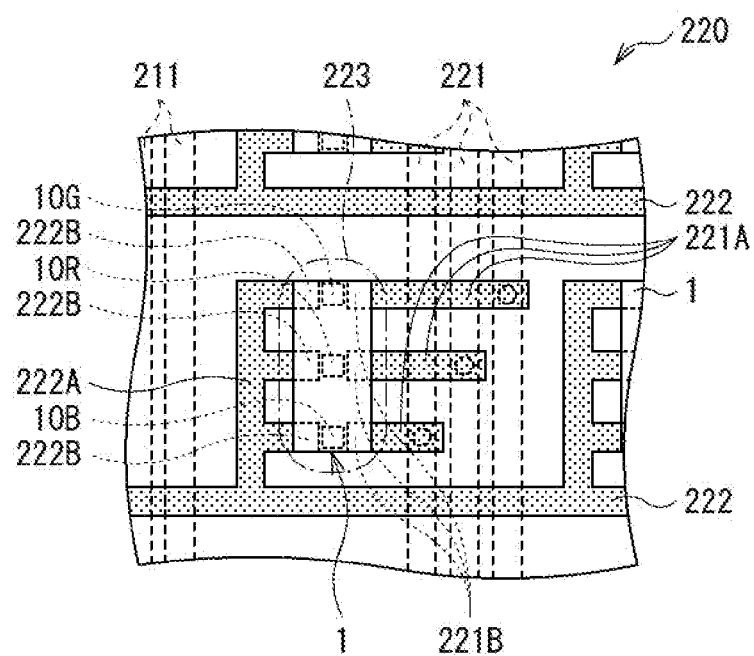

[FIG. 11A]
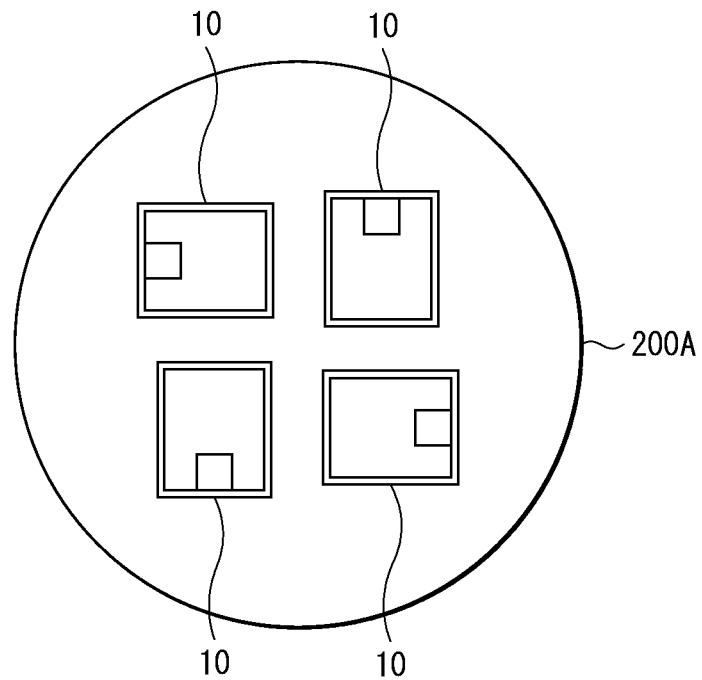
[FIG. 11B]
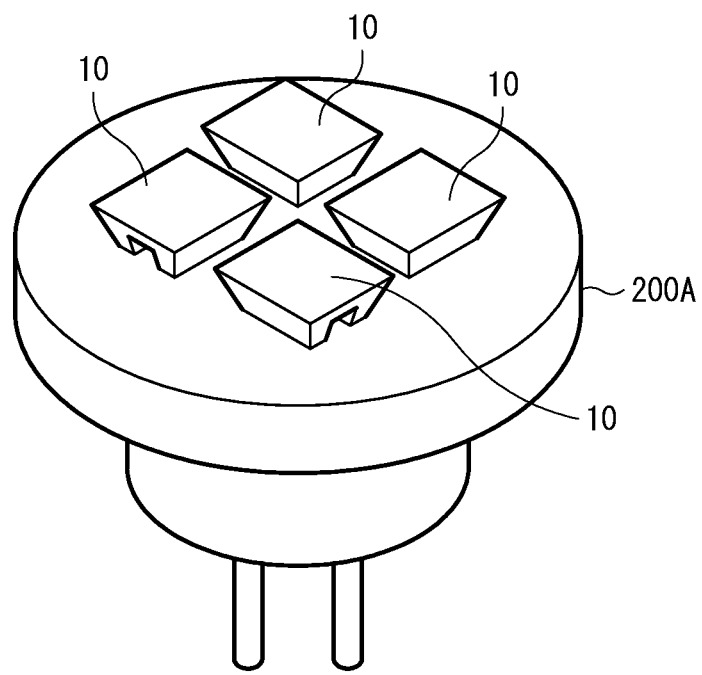

[FIG. 12A]
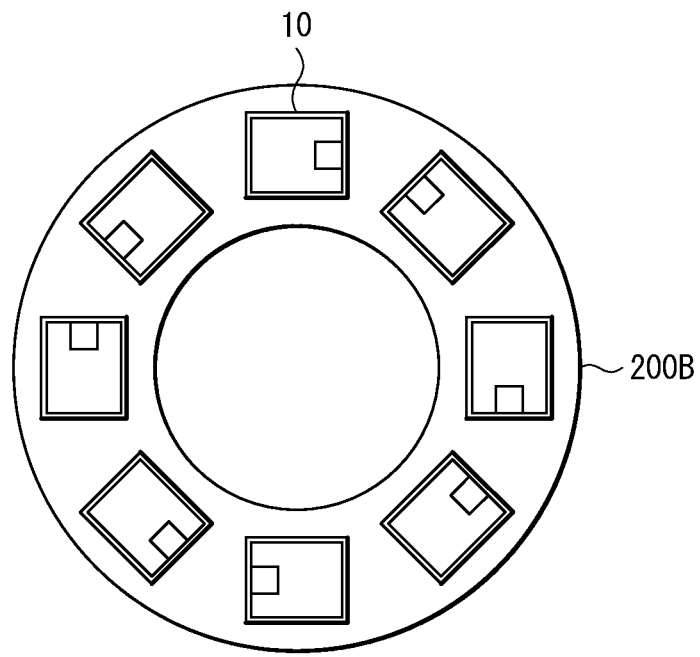
[FIG. 12B]
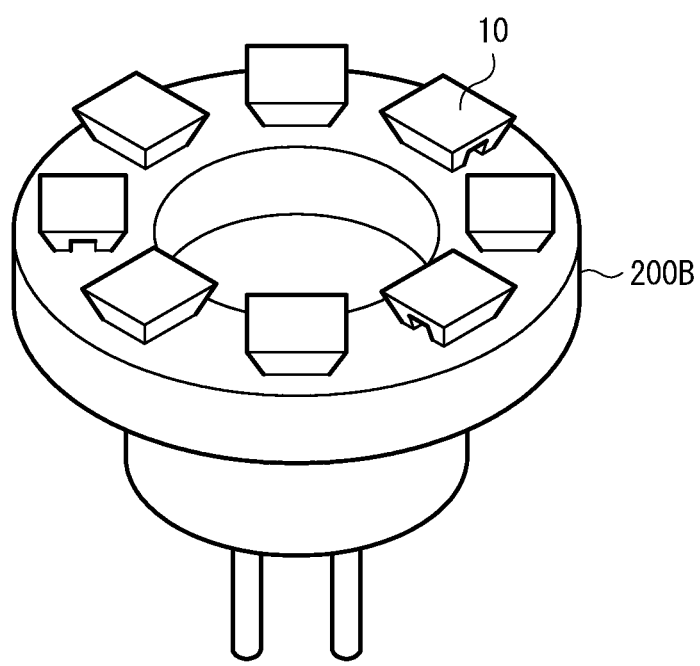

[FIG. 13A]
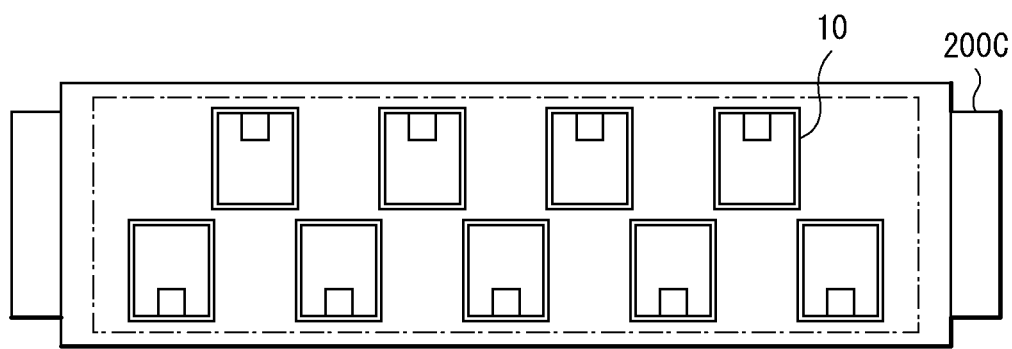
[FIG. 13B]
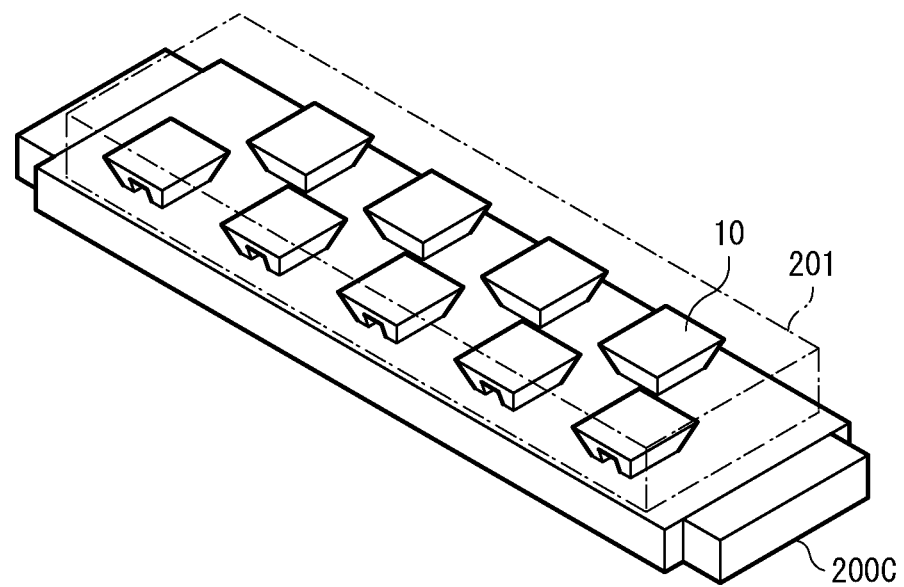

LIGHT-EMITTING ELEMENT AND IMAGE DISPLAYING APPARATUS

CROSS REFERENCE TO RELATED APPLICATIONS

This application is a U.S. National Phase of International Patent Application No. PCT/JP2019/039366 filed on Oct. 4, 2019, which claims priority benefit of Japanese Patent Application No. JP 2018-197374 filed in the Japan Patent Office on Oct. 19, 2018. Each of the above-referenced applications is hereby incorporated herein by reference in its entirety.

TECHNICAL FIELD

The present disclosure relates to a light-emitting element that emits light in a stack direction of a semiconductor and to an image displaying apparatus including the same.

BACKGROUND ART

In recent years, an illumination apparatus or an image displaying apparatus configured by collecting a plurality of light-emitting elements such as light-emitting diodes (LEDs) has become popular. Among them, an LED display using the LEDs for display pixels is attracting attention as a light and thin display, and various improvements such as improvement of light emission efficiency have been made.

For example, Patent Literature 1 discloses a light-emitting element including a configuration in which a semiconductor layer and a contact layer are stacked. The semiconductor layer has a first conductive-type layer, an active layer, and a second conductive-type layer. The light-emitting element improves a light extraction efficiency in a front direction, by providing an insulating layer including a transparent material having a predetermined refractive index on the contact layer formed on a light extraction surface side.

CITATION LIST

Patent Literature

Patent Literature 1: Japanese Unexamined Patent Application Publication No. 2016-4892

SUMMARY OF THE INVENTION

Incidentally, in a light-emitting element constituting an illumination apparatus or a display apparatus, compatibility between connectivity with an electrically conductive electrode and a light extraction efficiency is demanded.

It is desirable to provide a light-emitting element and an image displaying apparatus that allow for compatibility between connectivity with an electrically conductive electrode and a light extraction efficiency.

A light-emitting element according to one embodiment of the present disclosure includes: a semiconductor layer having a first surface and a second surface, and including a first conductive-type layer, an active layer, and a second conductive-type layer that are stacked in order from the first surface side; a first dielectric layer provided on the second surface side of the semiconductor layer and having an opening; a first electrode electrically coupled to the first conductive-type layer on the first surface side of the semiconductor layer; and a second electrode provided on the first dielectric layer and electrically coupled to the second conductive-type layer via the opening.

The image displaying apparatus according to one embodiment of the present disclosure includes the light-emitting element according to one embodiment described above as a plurality of the light-emitting elements.

In the light-emitting element according to one embodiment of the present disclosure and the image displaying apparatus according to one embodiment of the present disclosure, the first dielectric layer having the opening is provided on the second surface side of the semiconductor layer in which the first conductive-type layer, the active layer, and the second conductive-type layer are stacked, and the second conductive-type layer and the second electrode provided on the first dielectric layer are electrically coupled to each other via the opening. Hence, it is possible to reduce a formation region of the second electrode while enlarging a margin of positional deviation between, for example, an external wiring line disposed on, for example, the light-emitting element and the second electrode.

BRIEF DESCRIPTION OF THE DRAWINGS

FIG. 1A includes a schematic cross-sectional diagram (A) and a schematic plan diagram (B) illustrating an example of a configuration of a light-emitting element according to a first embodiment of the present disclosure.

FIG. 1B is a schematic cross-sectional diagram illustrating another example of the configuration of the light-emitting element according to the first embodiment of the present disclosure.

FIG. 1C is a schematic cross-sectional diagram illustrating another example of the configuration of the light-emitting element according to the first embodiment of the present disclosure.

FIG. 2A is a schematic plan diagram illustrating an example of coupling of an external wiring line to the light-emitting element illustrated in FIG. 1.

FIG. 2B is a schematic cross-sectional diagram illustrating a configuration of the light-emitting element and the external wiring line illustrated in FIG. 2A.

FIG. 3A is a schematic plan diagram illustrating another example of coupling of the external wiring line to the light-emitting element illustrated in FIG. 1.

FIG. 3B is a schematic cross-sectional diagram illustrating a configuration of the light-emitting element and the external wiring line illustrated in FIG. 3A.

FIG. 4A is a perspective diagram illustrating an example of a configuration of a light-emitting unit including a plurality of the light-emitting elements illustrated in FIG. 1.

FIG. 4B is a schematic diagram illustrating a cross-sectional configuration of the light-emitting unit illustrated in FIG. 4A.

FIGS. 5A and 5B include a schematic cross-sectional diagram FIG. 5A and a schematic plan diagram FIG. 5B illustrating an example of a configuration of a typical light-emitting element.

FIGS. 6A and 6B include a schematic cross-sectional diagram FIG. 6A and a schematic plan diagram FIG. 6B illustrating an example of a configuration of a light-emitting element according to a second embodiment of the present disclosure.

FIG. 7A is a schematic cross-sectional diagram illustrating an example of a configuration of a light-emitting element according to a third embodiment of the present disclosure.

FIG. 7B is a schematic plan diagram illustrating the light-emitting element illustrated in FIG. 7A.

FIG. 8 is a schematic plan diagram illustrating an example of a configuration of a light-emitting element according to a modification example of the present disclosure.

FIG. 9 is a perspective diagram illustrating an example of a configuration of a display apparatus provided with the light-emitting element illustrated in FIG. 1 or the like as an application example.

FIG. 10 is a schematic diagram illustrating an example of a layout of the display apparatus illustrated in FIG. 9.

FIG. 11A is a plan diagram illustrating an example of an illumination apparatus as an application example.

FIG. 11B is a perspective diagram illustrating the illumination apparatus illustrated in FIG. 11A.

FIG. 12A is a plan diagram illustrating another example of the illumination apparatus as an application example.

FIG. 12B is a perspective diagram illustrating the illumination apparatus illustrated in FIG. 12A.

FIG. 13A is a plan diagram illustrating another example of an illumination apparatus as an application example.

FIG. 13B is a perspective diagram illustrating the illumination apparatus illustrated in FIG. 13A.

MODES FOR CARRYING OUT THE INVENTION

Hereinafter, an embodiment of the present disclosure will be described in detail with reference to the drawings. The following description is a specific example of the present disclosure, but the present disclosure is not limited to the following embodiment. In addition, the present disclosure is not limited to arrangement, dimensions, dimensional ratios, and the like of the constituent elements illustrated in the drawings. It is to be noted that the description is given in the following order.

1. First Embodiment (an example in which a dielectric layer is provided on a second conductive-type layer and the second conductive-type layer and a second electrode are electrically coupled to each other through an opening provided on the dielectric layer)
1-1. Configuration of Light-Emitting Element
1-2. Configuration of Light-Emitting Unit
1-3. Workings and Effects
2. Second Embodiment (an example in which the second electrode has a single-layer structure)
3. Third Embodiment (an example in which a concave-convex structure is provided around the second electrode)
4. Modification Examples (an example in which the second electrode is arranged on the diagonal line of a light extraction surface)
5. Application Examples

1. First Embodiment (A) of FIG. 1A schematically illustrates a cross-sectional configuration of a light-emitting element (a light-emitting element 10) according to a first embodiment of the present disclosure, and (B) of FIG. 1A schematically illustrates a planar configuration of the light-emitting element 10 illustrated in (A) of FIG. 1A. Note that (A) of FIG. 1A represents a cross section taken along the line I-I illustrated in (B) of FIG. 1A. The light-emitting element 10 is an LED chip, and is suitably used as a display pixel of an image displaying apparatus (e.g., a display apparatus 2 (see FIG. 9)) referred to as a so-called LED display, for example.

The light-emitting element 10 has a semiconductor layer 11 (a semiconductor layer) in which a first conductive-type layer 12, an active layer 13, and, for example, two layers including second conductive-type layers 14 and 15 are stacked in this order. A lower surface of the first conductive-type layer 12 is a back surface (a surface S1; a first surface) of the semiconductor layer 11 and an upper surface of the second conductive-type layer 15 is a light extraction surface (a surface S2; a second surface) of the semiconductor layer 11. A side surface (a surface S3) of the light-emitting element 10 has an inclined surface intersecting a stack direction (Y-axis direction) of each layer, as illustrated in (A) of FIG. 1A. Specifically, a cross section of the light-emitting element 10 has an inverted trapezoidal shape. The light-emitting element 10 has a first electrode 21 on the surface S1 side of the semiconductor layer 11 and a second electrode 22 on the surface S2 side of the semiconductor layer 11. In the light-emitting element 10 of the present embodiment, a dielectric layer 19 (a first dielectric layer) is provided on the second conductive-type layer 15 of the semiconductor layer 11, and the second conductive-type layer 15 and the second electrode 22 are electrically coupled to each other through an opening 19H provided on the dielectric layer 19. On the side surface (the surface S3) of the semiconductor layer 11 and the lower surface (the surface S1) of the semiconductor layer 11, a laminated film in which a dielectric layer 16, a metal layer 17, and a dielectric layer 18 are stacked is provided. The first electrode 21 is electrically coupled to the first conductive-type layer 12 via an opening 16H provided on the laminated film.

(1-1. Configuration of Light-Emitting Element)

The light-emitting element 10 is a solid-state light-emitting element that emits light of a predetermined wave form from the upper surface (the light extraction surface; the surface S2). Specifically, the light-emitting element 10 is an LED (Light Emitting Diode) chip. The LED chip refers to a state in which the LED chip is cut out from a wafer used for crystal growth, and does not refer to a package-type covered with a molded resin or the like. The LED chip has a size of, for example, 5 μm or more and 100 μm or less, and is a so-called micro LED. A planar shape of the LED chip, for example, is substantially square. The LED chip has a flake shape. An aspect ratio (height/width) of the LED chip is desirably 0.1 or more and less than 1, for example, in order to prevent light from being absorbed.

Hereinafter, the respective members constituting the light-emitting element 10 will be described.

Materials of the first conductive-type layer 12, the active layer 13, and the second conductive-type layers 14 and 15 constituting the semiconductor layer are appropriately selected depending on light of a desired wavelength band. Specifically, in a case where light of a red band is to be obtained, it is preferable to use, for example, an AlGaInP-based semiconductor material. In a case where light of a blue band or light of a green band is to be obtained, it is preferable to use, for example, a AlGaInN-based semiconductor material.

The first conductive-type layer 12 is electrically coupled to the first electrode 21 and includes, for example, an n-type AlGaInP. The active layer 13 has, for example, a multi-quantum well structure including a well layer and a barrier layer, each of which is configured by semiconductors having compositions different from each other, and is configured to emit light of a predetermined wavelength. The active layer 23 according to the present embodiment is able to emit red light having an emission wavelength of, for example, 500 nm or more and 700 nm or less. The active layer 23 includes, for example, the well layer of about 3 to 20 layers containing GaInP and the barrier layer of about 2 to 19 layers containing AlGaInP, with the well layer and the barrier layer being stacked mutually. For example, for blue and green light emission, the first conductive-type layer 12 preferably includes the n-type AlGaInN, and the active layer 23 preferably includes, for example, the well layer of about 1 to 20 layers containing GaInN and the barrier layer of about 0 to 19 layers containing GaInN. It is possible to emit light having the emission wavelength of, for example, 400 nm or more and 600 nm or less.

The second conductive-type layer 14 is formed on the active layer 13 and includes, for example, p-type AlGaInP. The second conductive-type layer 15 is provided on the second conductive-type layer 14 and is electrically coupled to the second electrode 22. The second conductive-type layer 15 is provided on the entire light extraction surface (the surface S2) of the semiconductor layer 11 in plan view, and a region where the second electrode 22 is not formed constitutes a light extraction region of the light-emitting element 10. The second conductive-type layer 15 preferably includes a material capable of making ohmic contact with the second electrode 22, and includes, for example, p-type GaP. For example, in a case of blue light emission and green light emission, the second conductive-type layer 14 preferably uses a layer containing n-type AlGaInN, and the second conductive-type layer 15 preferably uses a layer containing p-type GaInN.

The dielectric layer 16 is for electrically insulating the metal layer 17 from the semiconductor layer 11. The dielectric layer 16 is provided on the entire side surface (the surface S3) of the semiconductor layer 11, and is further provided so as to cover a peripheral part of a surface of a contact part 21A constituting the first electrode 21. As a material of the dielectric layer 16, a material which is able to transmit light emitted from the active layer 13 is preferably used. For example, a silicon oxide ($SiO_x$), a silicon nitride ($SiN_x$), an aluminum oxide ($AlO_x$), a titanium oxide ($TiO_x$), a titanium nitride (TiN), or the like may be used. A thickness of the dielectric layer 16 is, for example, about 0.1 μm to 1 μm, and is substantially uniform depending on a film forming direction. Note that the dielectric layer 16 may have a thickness non-uniformity caused by a manufacturing error. Further, because films of the semiconductor wafer are often formed from the upper side or the lower side, the dielectric layer 16 formed on the side surface (the surface S3) of the semiconductor layer 11 tends to have a thin film thickness.

The metal layer 17 is for shielding or reflecting light emitted from the active layer 13. The metal layer 17 is formed in contact with the surface of the dielectric layer 16. An end on the light extraction surface S2 side of the metal layer 17 is formed on the same surface as the light extraction surface S2 side of the second conductive-type layer 15, for example. Meanwhile, an end on the second electrode 22 side of the metal layer 17 is formed in the vicinity of an end of the first electrode 21 with, for example, the dielectric layer 16 therebetween. That is, the metal layer 17, the semiconductor layer 11, the second electrode 22, and the first electrode 21 are insulated and separated (electrically separated) by the dielectric layer 16. As a material of the metal layer 17, it is preferable to use a material that shields or reflects the light emitted from the active layer 13. For example, titanium (Ti), aluminum (Al), copper (Cu), gold (Au), silver (Ag) or nickel (Ni) or an alloy thereof may be used. A thickness of the metal layer 17 is, for example, about 0.1 μm to 1 μm, and is substantially uniform depending on the film forming direction. Note that the metal layer 17 may have a thickness non-uniformity caused by a manufacturing error. In addition, because the semiconductor wafer is often formed from the upper side or the lower side, the metal layer 17 formed on the side surface (the surface S3) of the semiconductor layer 11 tends to have a thin film thickness as in a case of the dielectric layer 16. In addition, the metal layer 17 may have a structure surrounded by the dielectric layer 19, the dielectric layer 16, and the dielectric layer 18 as illustrated in FIG. 1A, depending on a manufacturing method, at a meeting part (a part where the surface S2 and the surface S3 intersect) of the dielectric layer 19 and the dielectric layers 16 and 18, but a portion may be exposed depending on the manufacturing method.

The dielectric layer 18 is intended to prevent mutual short-circuiting of a conductive material (e.g., solder, plating or a sputtered metal) and the metal layer 17 when mounting the light-emitting element 10 on a board for mounting (e.g., a wiring line substrate 52 (see FIG. 2B)). The conductive material bonds a pad part 21B constituting the first electrode 21 and the substrate for mounting to each other. The dielectric layer 18 is formed in contact with the surface of the metal layer 17 and the surface of the dielectric layer 16 that covers the periphery of the contact part 22A of the first electrode 21. The dielectric layer 18 is formed on the entire surface of the metal layer 17 and is formed on the whole or a portion of the dielectric layer 16. As a material of the dielectric layer 18, it is possible to use a material similar to the dielectric layer 16. For example, a silicon oxide ($SiO_x$), a silicon nitride ($SiN_x$), an aluminum oxide ($AlO_x$), a titanium oxide ($TiO_x$), a titanium nitride (TiN), or the like may be used. Further, the dielectric layer 18 may include a plurality of materials among the above materials. A thickness of the dielectric layer 18 is, for example, about 0.1 μm to 1 μm, and is substantially uniform depending on the film forming direction. Note that the dielectric layer 18 may have a thickness non-uniformity caused by a manufacturing error. In addition, because the semiconductor wafer is often formed from the upper side or the lower side, the dielectric layer 18 formed on the side surface (the surface S3) of the semiconductor layer 11 tends to have a thin film thickness as in a case of the dielectric layer 16 and the metal layer 17.

The dielectric layer 19 is provided on the second conductive-type layer 15 for protecting the semiconductor layer 11 (specifically, the surface of the second conductive-type layer 15) and for improving the luminous intensity in a front direction of the light-emitting element 10. As will be described in detail later, the dielectric layer 19 has an opening 19H so as to expose the contact part 21A constituting the second electrode 22 provided, for example, directly on the second conductive-type layer 15. A part of the vicinity of the opening 19H is formed on the contact part 21A so as to cover the periphery of the contact part 21A.

As a material of the dielectric layer 19, a material having light transmittance and having a refractive index difference from the second conductive-type layer 15 of 0.3 or more, more preferably 1.0 or more, and smaller than the refractive index of the second conductive-type layer 15 is preferred. Examples of such a material include alumina ($Al_xO_y$), a silicon oxide ($SiO_x$), and a silicon nitride ($Si_xN_y$). The dielectric layer 19 is configured as a single layer film or a laminated film that includes the above material. Alternatively, a titanium oxide ($TiO_x$), a titanium nitride (TiN), or the like may be used as the dielectric layer 19. Thus, it is possible to improve the light emission intensity in the front direction while ensuring the insulating property of the light extraction surface (the surface S1) of the light-emitting element 10. A thickness of the dielectric layer 19 is preferably, for example, 100 μm or more and 800 μm or less, more preferably, 400 μm or more and 600 μm or less, and is substantially uniform. Note that the dielectric layer 19 may have a thickness non-uniformity caused by a manufacturing error.

The first electrode 21 is electrically coupled to the lower surface (the surface S1) of the semiconductor layer 11, i.e., to the first conductive-type layer 12. That is, the first electrode 21 is in ohmic contact with the first conductive-type layer 12 and is formed, for example, as an n-electrode. The first electrode 21 is configured by the contact part 21A provided, for example, directly on the first conductive-type layer 12, and by a pad part 21B provided on the dielectric layer 16 and the dielectric layer 18. The pad part 21B is electrically coupled to the contact part 21A through the opening 16H provided on the dielectric layer 16.

The first electrode 21 is a metal electrode, and is configured as a multilayered electrode of, for example, titanium (Ti)/platinum (Pt)/gold (Au) or an alloy of gold and germanium (AuGe)/Ni (nickel)/Au. In addition, the first electrode 21 may include a highly reflective metal material such as silver (Ag) or aluminum (Al). The contact part 21A and the pad part 21B constituting the first electrode 21 may include the same material as each other, but it is preferable to use, for example, AuGeNi/Au for the contact part 21A from the viewpoint of making ohmic contact with GaAs constituting the first conductive-type layer 12. The pad part 21B preferably includes, for example, TiPtAu from the viewpoint of subsequent wiring line connection.

Further, the contact part 21A may be formed as a laminated film including a contact layer 21A1 and a metal layer 21A2, for example, as illustrated in FIG. 1B. As the contact layer 21A1, a material which allows for ohmic contact with the first conductive-type layer 12 is preferably used. For example, an n-type GaAs material or the like may be used, for example. For the metal layer 21A2, gold (Au), germanium (Ge), and nickel (Ni) are preferably used. In this manner, using the laminated film of the contact layer 21A1 and the metal layer 21A2 as the contact part 21A makes it possible to avoid light-absorption by the semiconductor material such as n-type GaAs constituting the contact layer 21A1 while allowing for the ohmic contact with the first conductive-type layer 12.

The second electrode 22 is provided on the light extraction surface (the surface S1) side. The second electrode 22 is in contact with the second conductive-type layer 15, and is electrically coupled to the second conductive-type layer 15. That is, the second electrode 22 is in ohmic contact with the second conductive-type layer 15 and is formed, for example, as a p-electrode. The second electrode 22 has a horizontally long plane shape having, for example, an aspect ratio of 1 or more, more preferably, an aspect ratio of 2 or more, and having a longitudinal direction and a short direction, as illustrated in (B) of FIG. 1A, for example. Here, the longitudinal direction is the X-axis direction, and the short direction is the Z-axis direction. Specifically, the second electrode 22 has a substantially symmetrical structure including: a connection part 22X having, for example, a substantially circular shape at a position corresponding to the opening 19H; and extension parts 22Y extending in directions opposite to each other with the connection part 22X therebetween and having a width smaller than the diameter of the connection part 22X. Further, the second electrode 22 of the present embodiment is configured by, for example, the contact part 22A provided, for example, directly on the second conductive-type layer 15 and the pad part 22B provided on the dielectric layer 19.

The contact part 22A is formed, for example, in a substantially circular shape directly above the second conductive-type layer 15. A size (a1) of an uniaxial direction (for example, the X-axis direction) of the contact part 22A is preferably equal to or less than a size (b1) (a1≤b1) in an uniaxial direction (for example, the X-axis direction) of the contact part 21A of the first electrode 21 described above, for example, as illustrated in FIG. 1A, in a case where the first conductive-type layer 12 and the contact part 21A do not absorb the light emitted from the active layer 13, for example. Further, for example, in a case where one or both of the first conductive-type layer 12 and the contact part 21A absorb the light emitted from the active layer 13, it is preferable that the size (a1) be equal to or greater than the size (b1) (a1≥b1) in the uniaxial direction (for example, in the X-axis direction) of the contact part 21A of the first electrode 21 described above, as illustrated in FIG. 1C, for example. Absorption in this case refers to absorption in which a band gap of a semiconductor is smaller than the energy of an emission wavelength, and does not include absorption by a free carrier or a dopant. The pad part 22B is electrically coupled to the contact part 22A through the opening 19H provided on the dielectric layer 19. The pad part 22B constitutes a planar shape of the second electrode 22 described above. The pad part 22B has, in plan view, a horizontally long shape having, for example, an aspect ratio of 1 or more, more preferably an aspect ratio of 2 or more, for example, in which the X-axis direction is the longitudinal direction and the Z-axis direction is the short direction thereof. The pad part 22B has the connection part 22X at a middle part and an extension part 22Y at both ends thereof. That is, the pad part 22B has a substantially symmetrical structure with the opening 19H interposed therebetween. The connection part 22X covers the opening 19H of the dielectric layer 19 and is coupled to the contact part 22A. The extension part 22Y is for ensuring that the second electrode 22 is electrically coupled to a wiring line 51 (e.g., refer to FIG. 2A) to be described later. Further, a minimum diameter of the pad part 22B (a width in the Z-axis direction in FIG. 1A) is preferably smaller than a minimum diameter of the pad part 21B of the first electrode 21 (for example, a width in the Z-axis direction).

The second electrode 22 is a metal electrode. The second electrode 22 includes, for example, titanium (Ti), platinum (Pt), aluminum (Al), gold (Au), rhodium (Ph), and copper (Cu), or is configured as a multilayer body thereof. The contact part 22A and the pad part 22B constituting the second electrode 22 may be formed using the same material as each other. However, the contact part 22A is preferably formed using, for example, titanium (Ti), platinum (Pt), aluminum (Al), and gold (Au) from the viewpoint of semiconductor connection, and the pad part 22B is preferably formed using, for example, titanium (Ti), platinum (Pt), aluminum (Al), gold (Au), rhodium (Ph), and copper (Cu) from the viewpoint of wiring line connection and light reflection.

FIG. 2A schematically illustrates, in plan view, an example of connection between the light-emitting element 10 of the present embodiment and an external wiring line (a wiring line 51). For example, the external wiring line is for controlling driving of a plurality of light-emitting elements 10 arranged in a display apparatus 2 to be described later. FIG. 2B schematically illustrates a cross-sectional configuration of FIG. 2A. FIG. 3A schematically illustrates, in plan view, another example of the connection between the light-emitting element 10 of the present embodiment and the external wiring line (the wiring line 51). For example, the external wiring line is for controlling the driving of the plurality of light-emitting elements 10 arranged in the display apparatus 2 to be described later. FIG. 3B schematically illustrates a cross-sectional configuration of FIG. 3A. In the present embodiment, it is possible to enlarge a margin of positional deviation between the second electrode 22 and the wiring line 51, by so arranging the light-emitting element 10, with respect to an extending direction of the wiring line 51 (the Z-axis direction in FIG. 2A), that the longitudinal direction (for example, the X-axis direction) of the pad part 21B constituting the second electrode 22 intersects an extending direction of the wiring line 51. Further, as illustrated in FIG. 2B, the first electrode 21 is bonded to the wiring line substrate 52 for n-electrode connection using, for example, plating or solder bonding.

(1-2. Configuration of Light-Emitting Unit)

FIG. 4A is a perspective view of an example of a schematic configuration of the light-emitting unit 1. FIG. 4B illustrates an example of a cross-sectional configuration taken along II-II line of the light-emitting unit 1 in FIG. 4A. The light-emitting unit 1 is suitably applicable as a display pixel, for example, in a display apparatus 2 to be described later, and is a micropackage in which the plurality of light-emitting elements 10 is covered with a thin thickness resin.

In the light-emitting unit 1, the light-emitting elements 10 described above are arranged in a line with another light-emitting element 10 with a predetermined gap therebetween. The light-emitting unit 1 has, for example, an elongated configuration extending in an arrangement direction of the light-emitting elements 10. The gap between two light-emitting elements 10 adjacent to each other is, for example, equal to or larger than a size of each of the light-emitting elements 10. In some cases, the gap described above may be narrower than the size of each of the light-emitting elements 10.

The respective light-emitting elements 10 emit pieces of light of wavelength bands different from each other. For example, as illustrated in FIG. 4A, the three light-emitting elements 10 are configured by a light-emitting element 10G that emits light in a green band, a light-emitting element 10R that emits light in a red band, and a light-emitting element 10B that emits light in a blue band. For example, in a case where the light-emitting unit 1 has the elongated shape extending in the arrangement direction of light-emitting elements 10, the light-emitting element 10G is arranged in the vicinity of the short side of the light-emitting unit 1, for example, and the light-emitting element 10B is arranged in the vicinity of the short side, of the short sides of the light-emitting unit 1, which is different from the short side where the light-emitting element 10G is positioned in the vicinity thereof. The light-emitting element 10R is disposed, for example, between the light-emitting element 10G and the light-emitting element 10B. Note that, although the respective positions of the light-emitting elements 10R, 10G, and 10B are not limited to those described above, in the following, positional relationships of other components may sometimes be described on the premise that the light-emitting elements 10R, 10G, and 10B are arranged at the respective positions exemplified above.

As illustrated in FIGS. 4A and 4B, the light-emitting unit 1 further includes a chip-shaped insulator 40 that covers each of the light-emitting elements 10, and terminal electrodes 31 and 32 electrically coupled to each of the light-emitting elements 10. The terminal electrodes 31 and 32 are disposed on a bottom surface side of the insulator 40.

The insulator 40 holds and surrounds each of the light-emitting elements 10 from at least a side surface of each of the light-emitting elements 10 to a portion of an upper surface thereof, and has an opening 40H1 on each of the light-emitting elements 10. The insulator 40 includes, for example, a resin material such as silicone, acrylic, or epoxy. The insulator 40 may partially include another material such as polyimide. The insulator 40 has an elongated shape (e.g., a rectangular parallelepiped shape) extending in the arrangement direction of each of the light-emitting elements 10. A height of the insulator 40 is higher than a height of each of the light-emitting elements 10, and a lateral width of the insulator 40 (a width in the short direction) is larger than the width of each of the light-emitting elements 10. The insulator 40 itself has a size of, for example, 1 mm or less. The insulator 40 is in the form of a flake. An aspect ratio (maximum height/maximum lateral width) of the insulator 40 is small enough that the light-emitting unit 1 does not lie upon transferring of the light-emitting unit 1. For example, the aspect ratio (maximum height/maximum lateral width) is 1/5 or less.

For example, as illustrated in FIG. 4B, the insulator 40 has openings 40H2 at positions corresponding to positions immediately below the respective light-emitting elements 10. At least the pad part 21B described above (not illustrated in FIG. 4B) is exposed on the bottom surface of each of the openings 40H2. The pad part 21B is coupled to the terminal electrode 31 via, for example, a predetermined electrically conductive member (e.g., solder, plated metal). A bump 33 is a columnar electrically conductive member embedded in the insulator 40. A connection part 34 is a strip-shaped electrically conductive member formed on an upper surface of the insulator 40, and corresponds to the wiring line 51 illustrated in FIGS. 2A and 2B, for example. The terminal electrodes 31 and 32 mainly include Ti (titanium) and Cu (copper), for example. A portion of a surface of the terminal electrodes 31 and 32 may be coated with, for example, a material which is hard to oxidize, such as Au (gold).

(1-3. Workings and Effects)

Next, workings and effects of the light-emitting element 10 according to the present embodiment will be described.

As described above, an LED display using a plurality of LEDs for display pixels has attracted attention as a light and thin display, and various improvements such as improvement of light emission efficiency have been made. As a method of improving the light emission efficiency, for example, in a configuration in which a semiconductor layer having a first conductive-type layer, an active layer, and a second conductive-type layer and a contact layer are stacked, an insulating layer that includes a transparent material having a predetermined refractive index is provided on the contact layer serving as a light extraction surface, thereby improving a light extraction efficiency in a front direction. As a result, it is possible to improve a light emission intensity in the front direction and to improve the light emission efficiency.

FIG. 5A schematically illustrates a cross-sectional configuration of a typical light-emitting element 1000, and FIG. 5B schematically illustrates a planar configuration of the light-emitting element 1000 illustrated in FIG. 5A. Note that FIG. 5A illustrates a cross section taken along III-III line illustrated in FIG. 5B. In the typical light-emitting element 1000, a p-electrode 1022 is provided on a contact layer 1015 stacked on a semiconductor layer 1011 that includes a first conductive-type layer 1012, an active layer 1013, and a second conductive-type layer 1014, and an n-electrode 1021 is provided on a lower surface of the semiconductor layer 1011. Note that a laminated film in which a dielectric layer 1016, a metal layer 1017, and a dielectric layer 1018 are stacked in the order is formed on side surfaces of the semiconductor layer 1011 and the contact layer 1015 and the lower surface of the semiconductor layer 1011.

In the light-emitting element 1000, the dielectric layer 1019 is provided outside a formation region of the p-electrode 1022 on the contact layer 1015, and a portion of the dielectric layer 1019 is so provided as to cover the periphery of the contact layer 1015. Accordingly, in an LED display in which the plurality of light-emitting elements 1000 is arranged, upon coupling, to the p-electrode 1022, an external wiring line that controls driving of the light-emitting elements 1000 arranged in the respective display pixels, the external wiring line stride over a stacked portion including the p-electrode 1022 and the dielectric layer 1019. Hence, it is necessary to form the p-electrode 1022 to be large in order to ensure the coupling to the external wiring line, which can lead to shielding and absorption of the light accordingly and can lower the light extraction efficiency.

In contrast, according to the present embodiment, the second electrode 22 electrically coupled to the second conductive-type layer 15 on the light extraction surface (the surface S2) side of the semiconductor layer 11 is configured by the contact part 22A provided directly on the second conductive-type layer 15 and the pad part 22B provided on the dielectric layer 19 provided on the second conductive-type layer 15. The contact part 22A and the pad part 22B are coupled via the opening 19H provided on the dielectric layer 19 corresponding to the contact part 22A. Hence, it is possible to reduce a formation region of the second electrode 22 formed on the second conductive-type layer 15 (specifically, a formation region of the contact part 22A formed directly on the second conductive-type layer 15), and it is possible to increase a reflective region derived from the dielectric layer 19.

As described above, the light-emitting element 10 according to the present embodiment includes the dielectric layer 19 having the opening 19H at a predetermined position on the second conductive-type layer 15 that constitutes the light extraction surface (the surface S2) of the semiconductor layer 11 that includes the active layer 13, and the second electrode 22 electrically coupled to the second conductive-type layer 15 via the opening 19H is provided on the dielectric layer 19. Specifically, as the second electrode 22, the contact part 22A that ensures the electrical coupling with the second conductive-type layer 15 is provided on the second conductive-type layer 15, and the pad part 22B electrically coupled to the contact part 22A via the opening 19H provided on the contact part 22A is provided on the dielectric layer 19. Thus, it is possible to reduce the formation region where the second electrode 22 (specifically, the contact part 22A) is formed directly on the second conductive-type layer 15, and to increase the reflection region derived from the dielectric layer 19. That is, it is possible to improve the light extraction efficiency while ensuring the connectivity with the electrically conductive electrode (the wiring line 51).

In addition, in the present embodiment, the second electrode 22 is configured by two members including the contact part 22A and the pad part 22B. Hence, for example, it is possible to use the contact part 22A for forming the ohmic contact and to use the pad part 22B for coupling wiring lines, and to select the materials suitable for the respective functions of the contact part 22A and the pad part 22B.

Further, in the light-emitting element 10 according to the present embodiment, as described above, the pad part 22B is provided on the dielectric layer 19 and is electrically coupled to the contact part 22A formed on the second conductive-type layer 15 via the opening 19H provided on the dielectric layer 19. Thus, in the later-described LED display (the display apparatus 2) in which the multiple light-emitting elements 10 are arranged on the respective display pixels, it is possible to allow the wiring line 51 (for example, the connection part 34) that controls the driving of the light-emitting elements 10 arranged on the respective display pixels to be directly coupled to the second electrode 22 without striding over the stacked portion of the p-electrode 1022 and the dielectric layer 1019 as in the light-emitting element 1000 described above. Hence, it is possible to enlarge the margin of positional deviation between the wiring line 51 and the second electrode 22, and to improve a manufacturing yield and reliability.

Furthermore, in the present embodiment, for example, in a case where the first conductive-type layer 12 and the contact part 21A do not absorb the light emitted from the active layer 13, the size (a1) in, for example, the X-axis direction of the contact part 22A of the second electrode 22 is set to be equal to or less than the size (b1) in, for example, the X-axis direction of the contact part 21A of the first electrode 21, as illustrated in FIG. 1A. Further, for example, in a case where one or both of the first conductive-type layer 12 and the contact part 21A absorb the light emitted from the active layer 13, the size in, for example, the X-axis direction of the contact part 21A of the first electrode 21 is set to be equal to or smaller than the size in, for example, the X-axis direction of the contact part 22A of the second electrode 22. Furthermore, the minimum diameter of the pad part 22B (the width in the Z-axis direction) is made smaller than the minimum diameter of the pad part 21B of the first electrode 21 (for example, the width in the Z-axis direction similarly). This improves the light extraction efficiency and facilitates supporting of the light-emitting element 10.

Next, second and third embodiments and modification examples will be described. Components corresponding to the light-emitting element 10 according to the first embodiment are denoted by the same reference numerals, and descriptions thereof are omitted.

2. Second Embodiment

FIG. 6A schematically illustrates a cross-sectional configuration of a light-emitting element (a light-emitting element 60) according to a second embodiment of the present disclosure, and FIG. 6B schematically illustrates a planar configuration of the light-emitting element 60 illustrated in FIG. 6A. Note that FIG. 6A illustrates a cross section taken along IV-IV line illustrated in FIG. 6B. The light-emitting element 60 is suitably used as a display pixel of the image displaying apparatus (e.g., the display apparatus 2) referred to as, for example, a so-called LED display, as with the first embodiment described above.

The light-emitting element 60 has the semiconductor layer 11 (the semiconductor layer) in which the first conductive-type layer 12, the active layer 13, and, for example, two layers including the second conductive-type layers 14 and 15 are stacked in this order. The side surface (the surface S3) of the light-emitting element 60 has an inclined surface intersecting the stack direction (Y-axis direction) of each layer, as illustrated in FIG. 6A. Specifically, the side surface has the inclined surface such that a cross section of the light-emitting element 60 has an inverted trapezoidal shape. The light-emitting element 60 has the first electrode 21 on the surface S1 side of the semiconductor layer 11 and a second electrode 62 on the surface S2 side of the semiconductor layer 11. On the side surface and the lower surface of the semiconductor layer 11, a laminated film in which the dielectric layer 16, the metal layer 17, and the dielectric layer 18 are stacked in the order from the side surface (the surface S3) side is provided. The first electrode 21 is electrically coupled to the first conductive-type layer 12 through the laminated film. The light-emitting element 60 of the present embodiment differs from that of the first embodiment, in that the second electrode 62 is provided on the dielectric layer 19 as a continuous layer of a solid film that is collectively formed and has no re-formed boundaries, and in that the second electrode 62 is electrically coupled to the second conductive-type layer 15 through the opening 19H provided on the dielectric layer 19.

As described above, in the light-emitting element 60 according to the present embodiment, a metal layer having a solid film structure is formed as the second electrode 62 on the dielectric layer 19 provided on the second conductive-type layer 15 that constitutes the light extraction surface (the surface S2) of the semiconductor layer 11. Thus, in the present embodiment, a connection part between the second conductive-type layer 15 and the second electrode 62 is flatter than that of the light-emitting element 10 according to the first embodiment described above. Hence, in addition to the effect according to the first embodiment described above, an effect is achieved in which it is possible to electrically couple the second electrode 62 and the external wiring line (for example, the wiring line 51) more easily. Further, because formation processes are eliminated as compared with the light-emitting element 10 according to the first embodiment described above, it is possible to reduce costs.

3. Third Embodiment

FIG. 7A schematically illustrates a cross-sectional configuration of a light-emitting element (a light-emitting element 70) according to a third embodiment of the present disclosure, and FIG. 7B schematically illustrates a planar configuration of the light-emitting element 70 illustrated in FIG. 7A. Note that FIG. 7A illustrates a cross section taken along V-V line illustrated in FIG. 7B. The light-emitting element 70 is, for example, an LED chip, and is suitably used as a display pixel of the image displaying apparatus (e.g., the display apparatus 2) referred to as, for example, a so-called LED display, as with the first embodiment described above.

The light-emitting element 70 has the semiconductor layer 11 (the semiconductor layer) in which the first conductive-type layer 12, the active layer 13, and, for example, two layers including the second conductive-type layers 14 and 15 are stacked in this order. The side surface (the surface S3) of the light-emitting element 70 has an inclined surface intersecting the stack direction (Y-axis direction) of each layer, as illustrated in FIG. 7A. Specifically, the side surface has the inclined surface such that a cross section of the light-emitting element 70 has an inverted trapezoidal shape. The light-emitting element 70 has the first electrode 21 on the surface S1 side of the semiconductor layer 11 and the second electrode 22 on the surface S2 side of the semiconductor layer 11. On the side surface and the lower surface of the semiconductor layer 11, a laminated film in which the dielectric layer 16, the metal layer 17, and the dielectric layer 18 are stacked in the order from the side surface (the surface S3) side is provided. The first electrode 21 is electrically coupled to the first conductive-type layer 12 through the laminated film. The light-emitting element 70 of the present embodiment differs from that of the first and the second embodiments, in that a concave-convex structure (e.g., a concave part X) is provided outside the formation region of the second electrode 22 in the light extraction surface (the surface S2) of the semiconductor layer 11, for example. Note that in a case where the concave part is formed as the concave-convex structure as illustrated in FIG. 7A, it is preferable that the second conductive-type layer 15 layers or both the second conductive-type layer 14 and the second conductive-type layer 15 be processed and not processed up to the active layer 13.

As described above, in the light-emitting element 70 according to the present embodiment, the plurality of concave parts X is provided in the light extraction surface (the surface S2) of the semiconductor layer 11. Hence, it is possible to greatly increase the light extraction efficiency. Furthermore, it is possible to adjust the emission light, to be extracted from the light extraction surface (the surface S2), to have a desired emission angle. Accordingly, for example, it is possible to obtain a Lambertian light distribution.

4. Modification Examples

FIG. 8 schematically illustrates a planar configuration of a light-emitting element (a light-emitting element 80) according to a modification example of the present disclosure. The light-emitting element 80 is, for example, an LED chip, and is suitably used as a display pixel of the image displaying apparatus (e.g., the display apparatus 2) referred to as, for example, a so-called LED display, as with the first embodiment described above. The light-emitting element 80 according to the present modification example differs from the first, the second, and the third embodiments, in that a longitudinal direction of a first electrode 82 is disposed in a diagonal direction of the light-emitting element 80 having a substantially rectangular shape.

In this manner, the first electrode 81 is so provided that its longitudinal direction is substantially parallel to the diagonal direction of the light-emitting element 80 having the substantially rectangular shape. Thus, it is possible to form the extension part to be large in the longitudinal direction. Hence, it is possible to further enlarge the margin of positional deviation between the wiring line 51 and the first electrode 81.

5. Application Examples

Hereinafter, application examples of any of the light-emitting elements 10, 60, 70, and 80 described in the first to the third embodiments and the modification examples will be described. It is possible to apply any of the light-emitting element 10, 60, 70, and 80 according to the first to the third embodiments to, for example, the image displaying apparatus having, as the display pixels, the light-emitting unit (for example, the light-emitting unit 1) that uses the plurality of light-emitting elements, or an illumination apparatus that uses the light-emitting elements individually or as the light-emitting unit.

An example thereof will be described below.

Application Example 1

FIG. 9 is a perspective view of an example of a schematic configuration of the image displaying apparatus (the display apparatus 2). The display apparatus 2 is a so-called LED display, in which LEDs are used as the display pixels. The display apparatus 2 includes a display panel 210 and a drive circuit (not illustrated) that drives the display panel 210, for example, as illustrated in FIG. 9.

The display panel 210 includes a mounting substrate 220 and a transparent substrate 230 that are superimposed on each other. A surface of the transparent substrate 230 serves as an image displaying surface, and has a display region 2A in the middle part and a frame region 2B as a non-display region around the middle part.

FIG. 10 illustrates an example of a layout of a region corresponding to the display region 2A on the surface on the transparent substrate 230 side of the mounting substrate 220. As illustrated in FIG. 10, for example, multiple data wiring lines 221 are formed to extend in a predetermined direction and are arranged side by side at predetermined pitches, in the region corresponding to the display region 2A on the surface of the mounting substrate 220. In the region on the surface of the mounting substrate 220 corresponding to the display region 2A, for example, multiple scan wiring lines 222 are further formed so as to extend in a direction crossing (e.g., orthogonal) to the data wiring lines 221 and are arranged in side by side at predetermined pitches. The data wiring line 221 and the scan wiring line 222 include an electrically conductive material such as Cu, for example.

The scan wiring line 222 is formed on, for example, an outermost layer, and is formed on, for example, an insulating layer (not illustrated) formed on a surface of a base material. The base material of the mounting substrate 220 is configured by, for example, a glass substrate, a resin substrate, or the like, and the insulating layer on the base material includes, for example, $SiN_x$, $SiO_x$, or $Al_xO_y$. Meanwhile, the data wiring line 221 is formed in a layer different from the outermost layer that contains the scan wiring line 222 (for example, a layer lower than the outermost layer), and is formed, for example, inside the insulating layer on the base material. On the surface of the insulating layer, for example, black is provided as necessary in addition to the scan wiring line 222. The black is for enhancing the contrast, and includes a light absorbing material. The black is formed, for example, in at least a non-formation region of later-described pad electrodes 221B and 222B on the surface of the insulating layer. Note that the black may be omitted as necessary.

The vicinity of an intersection of the data wiring line 221 and the scan wiring line 222 is a display pixel 223, and a plurality of the display pixels 223 is arranged in a matrix in the display region 3A. The light-emitting unit 1 including the plurality of light-emitting elements 10 is mounted on each of the display pixels 223. Note that FIG. 10 exemplifies a case in which three light-emitting elements 10R, 10G, and 10B constitute one display pixel 223, and in which it is possible to output light of red from the light-emitting element 10R, light of green from the light-emitting element 10G, and light of blue from the light-emitting element 10B.

The light-emitting unit 1 is provided with a pair of terminal electrodes 31 and 32 for each of the light-emitting elements 10R, 10G, and 10B, for example. Further, one terminal electrode 31 is electrically coupled to the data wiring line 221, and the other terminal electrode 32 is electrically coupled to the scan wiring line 222. For example, the terminal electrode 31 is electrically coupled to the pad electrode 221B at an end of a branch 221A provided at the data wiring line 221. In addition, for example, the terminal electrode 32 is electrically coupled to the pad electrode 222B at an end of a branch 222A provided at the scan wiring line 222.

Each of the pad electrodes 221B and 222B is formed on, for example, the outermost layer, and is provided at a location where each of the light-emitting units 1 is mounted, for example, as illustrated in FIG. 10. Here, the pad electrodes 221B and 222B include, for example, an electrically conductive material such as Au (gold).

The mounting substrate 220 is further provided with a plurality of pillars (not illustrated) that regulates, for example, an interval between the mounting substrate 220 and the transparent substrate 230. The pillar may be provided in a region facing the display region 3A, or may be provided in a region facing the frame region 3B.

The transparent substrate 230 is configured by, for example, a glass substrate or a resin substrate. In the transparent substrate 230, a surface on the light-emitting unit 1 side may be flat, but is preferably a rough surface. The rough surface may be provided over the entire region that faces the display region 2A, or may be provided only in a region facing the display pixels 223. The rough surface has fine irregularities, and light emitted from the light-emitting elements 10R, 10G, and 10B enters the rough surface. It is possible to produce the irregularities on the rough surface by, for example, sandblasting, dry etching, or the like.

The drive circuit drives each of the display pixels 223 (each of the light-emitting units 1) on the basis of a picture signal. The drive circuit includes, for example, a data driver that drives the data wiring lines 221 coupled to the display pixels 223, and a scan driver that drives the scan wiring lines 222 coupled to the display pixels 223. The drive circuit may be mounted on, for example, the mounting substrate 220, or may be provided separately from the display panel 210 and coupled to the mounting substrate 220 via a wiring line (not illustrated).

Application Example 2

FIGS. 11A and 11B illustrate a planar configuration (FIG. 11A) and a perspective view configuration (FIG. 11B) of an illumination apparatus 200A, which is an example of the illumination apparatus using the light-emitting element 10 (or the light-emitting element 60, 70, or 80). As illustrated in FIGS. 11A and 11B, the light-emitting element 10 is so disposed that, for example, four light-emitting elements 10 are arranged point-symmetrically on a circular mounting stage (a mounting substrate). Of course, a method of arranging the light-emitting elements 10 may be a method other than the point symmetric method.

FIGS. 12A and 12B illustrate a planar configuration (FIG. 12A) and a perspective view configuration (FIG. 12B) of an illumination apparatus 200B, which is another example of the illumination apparatus using the light-emitting element 10. As illustrated in FIGS. 12A and 12B, the light-emitting element 10 is so disposed that, for example, eight light-emitting elements 10 are arranged on an annular mounting stage (the mounting substrate).

FIGS. 13A and 13B illustrate a planar configuration (FIG. 13A) and a perspective view configuration (FIG. 13B) of an illumination apparatus 200C, which is another example of the illumination apparatus using the light-emitting element. As illustrated in FIG. 243 and FIG. 13B, for example, nine light-emitting elements 10 are arranged on a mounting stage having a rectangular shape. The illumination apparatus 200C may include a sealing light cover.

Although the present disclosure has been described above with reference to the first to the third embodiments and the modification examples, the present disclosure is not limited to the above embodiments and the like, and various modifications can be made. For example, in the first embodiment, etc., although the second conductive-type layer is exemplified as a stacked-layer structure including the second conductive-type layer 14 and the second conductive-type layer 15, the second conductive-type layer does not have to have the stacked-layer structure, and may have a single-layer structure.

Note that it is also possible for the present disclosure to be configured as follows. According to the present technology having the following configuration, the first conductive-type layer, the active layer, and the second conductive-type layer are stacked in this order. In addition, the first dielectric layer and the second electrode are provided in the order on the second surface side of the semiconductor layer having the first surface facing the first conductive-type layer side and having the second surface facing the second conductive-type layer side. Further, the second conductive-type layer and the second electrode are electrically coupled to each other via the opening provided on the first dielectric layer. Thus, it is possible to enlarge the margin of positional deviation between, for example, the external wiring line disposed on, for example, the light-emitting element and the second electrode and to reduce the formation region of the second electrode. Hence, it is possible to improve the light extraction efficiency while ensuring the connectivity with the electrically conductive electrode. Note that the effects described herein are not necessarily limited, and may be any of the effects described in the present disclosure.

(1) A light-emitting element including:
a semiconductor layer having a first surface and a second surface, and including a first conductive-type layer, an active layer, and a second conductive-type layer that are stacked in order from the first surface side;
a first dielectric layer provided on the second surface side of the semiconductor layer and having an opening;
a first electrode electrically coupled to the first conductive-type layer on the first surface side of the semiconductor layer; and
a second electrode provided on the first dielectric layer and electrically coupled to the second conductive-type layer via the opening.

(2) The light-emitting element according to (1), in which the second electrode has a planar shape having a longitudinal direction and a short direction, and having an aspect ratio of greater than 1.

(3) The light-emitting element according to (1) or (2), in which the second electrode has a substantially symmetrical structure with the opening interposed therebetween.

(4) The light-emitting element according to any one of (1) to (3), in which the second electrode includes:
a connection part covering the opening and electrically coupled to the second conductive-type layer; and
extension parts extending in directions opposite to each other with the connection part therebetween.

(5) The light-emitting element according to (4), in which
the connection part has a substantially circular shape, and
the extension parts each extend with a width smaller than a diameter of the connection part.

(6) The light-emitting element according to any one of (1) to (5), in which the second electrode includes:
a contact part provided on the second conductive-type layer and having a periphery, at least a portion the periphery being covered by the first dielectric layer; and
a pad part provided on the first dielectric layer, and extending to inside of the opening and coupled to the contact part.

(7) The light-emitting element according to any one of (1) to (6), in which the semiconductor layer has a concave-convex structure positioned outside a region in which the second electrode is formed.

(8) The light-emitting element according to any one of (1) to (7), in which a metal layer is provided from a side surface of the semiconductor layer to the first surface of the semiconductor layer.

(9) The light-emitting element according to (8), in which
the metal layer forms a laminated film together with a second dielectric layer, and
the metal layer is provided from the side surface of the semiconductor layer to the first surface of the semiconductor layer via the second dielectric layer.

(10) The light-emitting element according to any one of (1) to (9), in which an external wiring line is coupled to the second electrode.

(11) The light-emitting element according to (10), in which
the second electrode has a planar shape having a longitudinal direction and a short direction, and
the external wiring line is disposed to intersect the longitudinal direction of the second electrode.

(12) The light-emitting element according to any one of (6) to (11),
in which the first electrode includes:
a contact part provided on the first conductive-type layer and having a periphery, at least a portion the periphery being covered by a second dielectric layer, the second dielectric layer being provided from a side surface of the semiconductor layer to the first surface of the semiconductor layer; and
a pad part extending to inside of an opening provided on the second dielectric layer, and coupled to the contact part, and
in which, in a case where the first conductive-type layer and the contact part of the first electrode do not absorb light emitted from the active layer, a size in an uniaxial direction of the contact part of the second electrode is equal to or less than a size in an uniaxial direction of the contact part of the first electrode.

(13) The light-emitting element according to (6) to (11),
in which the first electrode includes:
a contact part provided on the first conductive-type layer and having a periphery, at least a portion the periphery being covered by a second dielectric layer, the second dielectric layer being provided from a side surface of the semiconductor layer to the first surface of the semiconductor layer; and
a pad part extending to inside of an opening provided on the second dielectric layer, and coupled to the contact part, and
in which, in a case where one or both of the first conductive-type layer and the contact part of the first electrode absorb light emitted from the active layer, a size in an uniaxial direction of the contact part of the second electrode is equal to or greater than a size in an uniaxial direction of the contact part of the first electrode.

(14) The light-emitting element according to (6) to (13),
in which the first electrode includes:

a contact part provided on the first conductive-type layer and having a periphery, at least a portion the periphery being covered by a second dielectric layer, the second dielectric layer being provided from a side surface of the semiconductor layer to the first surface of the semiconductor layer; and a pad part extending to inside of an opening provided on the second dielectric layer, and coupled to the contact part, and in which a minimum diameter of the pad part of the second electrode is smaller than a minimum diameter of the pad part of the first electrode.

(15)

The light-emitting element according to any one of (1) to (14), in which the first electrode is electrically coupled to a structure body having a wiring line electrode.

(16)

The light-emitting element according to any one of (1) to (15), in which the first conductive-type layer includes an n-type semiconductor layer and the second conductive-type layer includes a p-type semiconductor layer, and the first electrode includes an n-electrode and the second electrode includes a p-electrode.

(17)

An image displaying apparatus with a plurality of light-emitting elements, the plurality of light-emitting elements including:

a semiconductor layer having a first surface and a second surface, and including a first conductive-type layer, an active layer, and a second conductive-type layer that are stacked in order from the first surface side;

a first dielectric layer provided on the second surface side of the semiconductor layer and having an opening;

a first electrode electrically coupled to the first conductive-type layer on the first surface side of the semiconductor layer; and a second electrode provided on the first dielectric layer and electrically coupled to the second conductive-type layer via the opening.

The present application claims the benefit of Japanese Priority Patent Application JP2018-197374 filed with the Japan Patent Office on Oct. 19, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A light-emitting element, comprising:
a semiconductor layer having a first surface and a second surface, wherein the semiconductor layer includes a first conductive-type layer, an active layer, and a second conductive-type layer that are stacked in order from a side of the first surface;
a first dielectric layer on a side of the second surface of the semiconductor layer, wherein the first dielectric layer has an opening;
a first electrode electrically coupled to the first conductive-type layer on the side of the first surface of the semiconductor layer, wherein the first electrode includes:
a first contact part on the first conductive-type layer, wherein
the first contact part has a periphery,
at least a portion of the periphery of the first contact part is covered by a second dielectric layer, and
the second dielectric layer is disposed from a side surface of the semiconductor layer to the first surface of the semiconductor layer; and
a first pad part that extends to inside of an opening in the second dielectric layer, wherein the first pad part is coupled to the first contact part; and
a second electrode on the first dielectric layer, wherein the second electrode is electrically coupled to the second conductive-type layer via the opening in the first dielectric layer,
the second electrode includes:
a second contact part on the second conductive-type layer, wherein
the second contact part has a periphery, and
at least a portion of the periphery of the second contact part is covered by the first dielectric layer; and
a second pad part on the first dielectric layer, wherein
the second pad part extends to inside of the opening in the first dielectric layer, and
the second pad part is coupled to the second contact part, and
in a case where the first conductive-type layer and the first contact part of the first electrode do not absorb light emitted from the active layer, a size in an uniaxial direction of the second contact part of the second electrode is equal to or less than a size in the uniaxial direction of the first contact part of the first electrode.

2. The light-emitting element according to claim 1, wherein
the second electrode has a planar shape having a longitudinal direction and a short direction, and
the planar shape has an aspect ratio of greater than 1.

3. The light-emitting element according to claim 1, wherein the second electrode has a substantially symmetrical structure with the opening of the first dielectric layer interposed therebetween.

4. The light-emitting element according to claim 1, wherein the second electrode further includes:
a connection part that covers the opening and that is electrically coupled to the second conductive-type layer; and
extension parts that extend in directions opposite to each other with the connection part therebetween.

5. The light-emitting element according to claim 4, wherein
the connection part has a substantially circular shape, and
the extension parts each extend with a width smaller than a diameter of the connection part.

6. The light-emitting element according to claim 1, wherein the semiconductor layer has a concave-convex structure positioned outside a region in which the second electrode is formed.

7. The light-emitting element according to claim 1, further comprising a metal layer from the side surface of the semiconductor layer to the first surface of the semiconductor layer.

8. The light-emitting element according to claim 7, wherein
the metal layer forms a laminated film together with the second dielectric layer, and
the metal layer is provided from the side surface of the semiconductor layer to the first surface of the semiconductor layer via the second dielectric layer.

9. The light-emitting element according to claim 1, wherein an external wiring line is coupled to the second electrode.

10. The light-emitting element according to claim 9, wherein
the second electrode has a planar shape having a longitudinal direction and a short direction, and
the external wiring line is disposed to intersect the longitudinal direction of the second electrode.

11. The light-emitting element according to claim 1, wherein a minimum diameter of the second pad part of the second electrode is smaller than a minimum diameter of the first pad part of the first electrode.

12. The light-emitting element according to claim 1, wherein the first electrode is electrically coupled to a structure body having a wiring line electrode.

13. The light-emitting element according to claim 1, wherein
the first conductive-type layer comprises an n-type semiconductor layer and the second conductive-type layer comprises a p-type semiconductor layer, and
the first electrode comprises an n-electrode and the second electrode comprises a p-electrode.

14. An image displaying apparatus, comprising:
a plurality of light-emitting elements, wherein each of the plurality of light-emitting elements comprises:
a semiconductor layer having a first surface and a second surface, wherein the semiconductor layer includes a first conductive-type layer, an active layer, and a second conductive-type layer that are stacked in order from a side of the first surface;
a first dielectric layer on a side of the second surface of the semiconductor layer, wherein the first dielectric layer has an opening;
a first electrode electrically coupled to the first conductive-type layer on the side of the first surface of the semiconductor layer, wherein the first electrode includes:
a first contact part on the first conductive-type layer, wherein
the first contact part has a periphery,
at least a portion of the periphery of the first contact part is covered by a second dielectric layer, and
the second dielectric layer is disposed from a side surface of the semiconductor layer to the first surface of the semiconductor layer; and
a first pad part that extends to inside of an opening in the second dielectric layer, wherein the first pad part is coupled to the first contact part; and
a second electrode on the first dielectric layer, wherein
the second electrode is electrically coupled to the second conductive-type layer via the opening in the first dielectric layer,
the second electrode includes:
a second contact part on the second conductive-type layer, wherein
the second contact part has a periphery, and
at least a portion of the periphery of the second contact part is covered by the first dielectric layer; and
a second pad part on the first dielectric layer, wherein
the second pad part extends to inside of the opening in the first dielectric layer, and
the second pad part is coupled to the second contact part, and
in a case where the first conductive-type layer and the first contact part of the first electrode do not absorb light emitted from the active layer, a size in an uniaxial direction of the second contact part of the second electrode is equal to or less than a size in the uniaxial direction of the first contact part of the first electrode.

15. A light-emitting element, comprising:
a semiconductor layer having a first surface and a second surface, wherein the semiconductor layer includes a first conductive-type layer, an active layer, and a second conductive-type layer that are stacked in order from a side of the first surface;
a first dielectric layer on a side of the second surface of the semiconductor layer, wherein the first dielectric layer has an opening;
a first electrode electrically coupled to the first conductive-type layer on the side of the first surface of the semiconductor layer, wherein the first electrode includes:
a first contact part on the first conductive-type layer, wherein
the first contact part has a periphery,
at least a portion of the periphery of the first contact part is covered by a second dielectric layer, and
the second dielectric layer is disposed from a side surface of the semiconductor layer to the first surface of the semiconductor layer; and
a first pad part that extends to inside of an opening in the second dielectric layer, wherein the first pad part is coupled to the first contact part; and
a second electrode on the first dielectric layer, wherein
the second electrode is electrically coupled to the second conductive-type layer via the opening in the first dielectric layer,
the second electrode includes:
a second contact part on the second conductive-type layer, wherein
the second contact part has a periphery, and
at least a portion of the periphery of the second contact part is covered by the first dielectric layer; and
a second pad part on the first dielectric layer, wherein
the second pad part extends to inside of the opening in the first dielectric layer, and
the second pad part is coupled to the second contact part, and
in a case where one or both of the first conductive-type layer and the first contact part of the first electrode absorb light emitted from the active layer, a size in an uniaxial direction of the second contact part of the second electrode is equal to or greater than a size in the uniaxial direction of the first contact part of the first electrode.

16. A light-emitting element, comprising:
a semiconductor layer having a first surface and a second surface, wherein the semiconductor layer includes a first conductive-type layer, an active layer, and a second conductive-type layer that are stacked in order from a side of the first surface;
a first dielectric layer on a side of the second surface of the semiconductor layer, wherein the first dielectric layer has an opening;
a first electrode electrically coupled to the first conductive-type layer on the side of the first surface of the semiconductor layer, wherein the first electrode includes:

a first contact part on the first conductive-type layer, wherein
the first contact part has a periphery,
at least a portion of the periphery of the first contact part is covered by a second dielectric layer, and
the second dielectric layer is disposed from a side surface of the semiconductor layer to the first surface of the semiconductor layer; and
a first pad part that extends to inside of an opening in the second dielectric layer, wherein the first pad part is coupled to the first contact part; and
a second electrode on the first dielectric layer, wherein the second electrode is electrically coupled to the second conductive-type layer via the opening in the first dielectric layer,
the second electrode includes:
a second contact part on the second conductive-type layer, wherein
the second contact part has a periphery, and
at least a portion of the periphery of the second contact part is covered by the first dielectric layer; and
a second pad part on the first dielectric layer, wherein
the second pad part extends to inside of the opening in the first dielectric layer, and
the second pad part is coupled to the second contact part, and
a minimum diameter of the second pad part of the second electrode is smaller than a minimum diameter of the first pad part of the first electrode.

* * * * *